US007232645B2

(12) United States Patent
Sawada et al.

(10) Patent No.: US 7,232,645 B2
(45) Date of Patent: Jun. 19, 2007

(54) SUPPORT FOR LITHOGRAPHIC PRINTING PLATE AND PRESENSITIZED PLATE

(75) Inventors: Hirokazu Sawada, Shizuoka (JP); Akio Uesugi, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/784,879

(22) Filed: Feb. 24, 2004

(65) Prior Publication Data

US 2004/0166442 A1 Aug. 26, 2004

(30) Foreign Application Priority Data

Feb. 25, 2003 (JP) ............................ 2003-047324

(51) Int. Cl.
*G03F 7/09* (2006.01)

(52) U.S. Cl. .................................... 430/278.1; 430/302

(58) Field of Classification Search ............. 430/270.1, 430/271.1, 272.1, 278.1, 302, 494, 944, 945
See application file for complete search history.

(56) References Cited

U.S. PATENT DOCUMENTS

| | | | | |
|---|---|---|---|---|
| 6,194,082 | B1 | 2/2001 | Sawada et al. | |
| 2003/0165768 | A1* | 9/2003 | Hotta et al. | 430/146 |
| 2003/0165775 | A1* | 9/2003 | Endo et al. | 430/278.1 |
| 2004/0063033 | A1* | 4/2004 | Hotta | 430/278.1 |
| 2004/0079252 | A1* | 4/2004 | Sawada et al. | 101/453 |

FOREIGN PATENT DOCUMENTS

| | | | | |
|---|---|---|---|---|
| EP | 0 853 132 | A1 | | 7/1998 |
| EP | 1 138 519 | A2 | | 10/2001 |
| EP | 1 142 708 | A1 | * | 10/2001 |
| EP | 1 172 228 | A2 | | 1/2002 |
| EP | 1 396 348 | A2 | | 3/2004 |
| EP | 1 442 894 | A1 | | 8/2004 |
| JP | 2000-37964 | A | | 2/2000 |
| JP | 2000-37965 | A | | 2/2000 |
| JP | 2000-108534 | A | | 4/2000 |

OTHER PUBLICATIONS

Patent Abstracts of Japan, vol. 2000, No. 5, Sep. 14, 2000, abstract of JP-A-2000-37965.
Patent Abstracts of Japan, vol. 2000, No. 5, Sep. 14, 2000, abstract of JP-A-2000-37964.
"Fundamentals of Aluminum Materials and Industrial Technology", published by Japan Light Metal Association, 1st edition, p. 12, May 1, 1985, partial.

* cited by examiner

*Primary Examiner*—Barbara L. Gilliam
(74) *Attorney, Agent, or Firm*—Sughrue Mion, PLLC

(57) ABSTRACT

The support for a lithographic printing plate obtained by performing graining treatment including electrochemical graining treatment on an aluminum plate, the aluminum plate is an aluminum plate which contains Fe of 0.02 to 0.29 wt %, Si of 0.03 to 0.15 wt %, Cu of 0.020 to 0.040 wt % and Ti of 0.050 wt % or less and whose remaining portion is composed of Al and unavoidable impurities. In addition, the support for a lithographic printing plate where surface area ratio and steepness obtained from three-dimensional data found with an atomic force microscope (AFM) each satisfies the specified conditions is excellent in printing performance (press life, scum resistance, sensitivity and cleaner press life or the like) and handling property (scratch resistance, fatigue fracture strength or the like) when the lithographic printing plate is prepared.

31 Claims, 1 Drawing Sheet

SUPPORT FOR LITHOGRAPHIC PRINTING PLATE AND PRESENSITIZED PLATE

BACKGROUND OF THE INVENTION

1. Field of the Invention

The present invention relates to a support for a lithographic printing plate and a presensitized plate. More particularly, the present invention relates to a presensitized plate excellent in printing performance (for example, press life, scum resistance, sensitivity and cleaner press life or the like) when a lithographic printing plate is prepared and handling property (scratch resistance, fatigue fracture strength or the like), having very uniform and fine pits on the surface of the support and the support for a lithographic printing plate used for the same. Specifically, the present invention relates to the presensitized plate where development treatment can be performed with a developer substantially containing no alkali metal silicates after exposure, the support for a lithographic printing plate used for the same and the presensitized plate where dotted exposure defective areas called dot residual layers are unlikely to occur in plate making using a laser source and the support for a lithographic printing plate used for the same, in addition to the aforementioned characteristics by attaching Si atoms to the surface of the support for a lithographic printing plate.

2. Description of the Related Art

A photosensitive presensitized plate with an aluminum plate as a support is widely used for offset lithography.

The lithography using the photosensitive presensitized plate like this is a printing system utilizing a property that water and an oil do not essentially mix, an area which receives water and repels an oily ink (hereinafter this area is referred to as “a non-image area”) and an area, which repels water and receives oily ink (hereinafter this area is referred to as “an image area”) are formed on the printing plate surface of the lithographic printing plate (prepared from the aforementioned presensitized plate) used for the lithography.

For an aluminum support for a lithographic printing plate (hereinafter merely referred to as “a support for a lithographic printing plate”) used for the lithographic printing plate, since the support is used so as to allow its surface to function as the non-image area, the support requires various opposite characteristics such as ones that hydrophilicity and water retention property are excellent, and that further, the adhesion with the image recording layer provided thereon is excellent or the like.

Known as a method of preparing the presensitized plate is generally the method that after graining treatment and anodizing treatment are performed on the surface of a sheeted or coiled aluminum to obtain a support for a lithographic printing plate, a photosensitive solution is coated on the support and is dried to form an image recording layer, and the support provided an image recording layers is cut into a desired size if required. After an image is printed, development processing is performed on the presensitized plate to prepare a lithographic printing plate.

In the method, it is effective to perform electrochemical graining treatment in an acid solution (also referred to as “electrolytic graining treatment” according to the present invention) in order to improve adhesion between the image recording layer and the support, and it is also effective to perform a surface treatment and coat an undercoat solution after anodizing treatment is performed.

If graining treatment including electrolytic graining treatment is performed, fine asperities (pits) are produced on the surface of the support. It is conventionally considered that by equalizing and increasing the diameters and deeping the depth, the adhesion between the image recording layer and the support is strengthened in the image area, and the image recording layers are not exfoliated or the like even though a number of sheets are printed, and that water retention property is excellent in the non-image area, scum is hardly generated since a large amount of fountain solution can be held on the surface thereof and thus, a presensitized plate excellent in printing property can be obtained. For example, the method of improving the shape and uniformity of electrolytically grained pits from such a viewpoint is proposed in JP 2000-108534 A, JP 2000-37965 and JP 2000-37964 A.

SUMMARY OF THE INVENTION

However, the inventors have thoroughly studied and found that the pits on the surface of the support are of almost bowl shapes, the diameters are even and big. In addition, if the depth is deep, the image recording layer and the support are sufficiently adhered to each other by allowing the image recording layer to enter the bottom portions of the pits. On the other hand, in the edge portions of the pits, since the image recording layers are relatively thin and the edge portions of the pits are sharp, a strong stress is likely to be applied to the image recording layers on the edges of the pits in printing, and thus, the image recording layers thereon are likely to be broken or exfoliated, and the adhesion between the image recording layer and the support in the areas is low and the areas are likely to be scummed.

Although as a countermeasure to the problem, known is the method that the sharpness of the edge portions are chemically dissolved, the inventors have found that if the edge portions are dissolved, the number of press life sheets (the number of printed sheets until printing can not be performed by the exfoliation or wear of the image recording layer in the image area of the lithographic printing plate) is likely to deteriorate. Namely, the inventors have found it difficult to satisfy both of the adhesion between the image recording layer and the support in the deeply recessed areas (also referred to as “deep areas” in the present invention) and the adhesion between the image recording layer on the edge portions of the pits and the support, and to achieve both press life and scum resistance in the conventional technology in which the diameters of the fine asperities (pits) produced on the surface of the support are equalized and increased and the depths are increased. In addition, the inventors have also found that the phenomenon in which the image recording layer is exfoliated (difficulty that press life and scum resistance can not be simultaneously achieved) is not only observed in a conventional-type presensitized plate but also significantly observed in a laser direct-exposed-image type presensitized plate (a presensitized plate for a laser printing plate).

In addition, if the edge portions of the pits are dissolved as stated above, it is difficult to hold the fountain solution on the surface of the non-image areas on the surface of the support, and hydrophilicity and water retention property deteriorate in the non-image areas on the surface of the support. Then, if printing is performed by using the lithographic printing plate prepared from the support, there also occurs a problem that ink is likely to be attached to the non-image areas in printing, thereby scum is more likely to be produced.

It is commonly performed that in the order to improve scum resistance in the lithographic printing plate, Si atoms are attached to only the non-image areas from which the image recording layers are removed by containing an alkali metal silicate in a developer to more improve hydrophilicity in the non-image areas even more. However, if development treatment is performed by using a developer containing the alkali metal silicate, there are problems that a solid matter attributable to $SiO_2$ is likely to precipitate, a gel attributable to $SiO_2$ is produced in the neutralization process when a waste developer is treated or the like.

On the contrary, proposed is a technology in which by treating in advance the surface of the support for a lithographic printing plate which is to be the non-image areas in the lithographic printing plate with an alkali metal silicate solution and then providing the image recording layers thereon, development treatment is performed by using the developer substantially containing no alkali metal silicate (for example, JP 11-109637 A or the like). However, this technology had a defect that the adhesion between the image recording layers and the support was weaken.

In addition, the applicants of the present invention have proposed that the grained structure with large undulation and the diameters of the pits out of the asperities on the surface of the support for a lithographic printing plate are limited to the certain ranges, and further, the pore diameter and pore density of the micropores existent in the anodizing layers are limited to the certain ranges, and the content of Cu in the aluminum is preferably limited to less than the certain range (specification in JP 2001-74171). In addition, what the content of Cu is limited to a certain range is described JP 1-47545 B, JP 8-337835 A, JP 7-197293 A or the like.

However, it could not be still said that the adhesion between the image recording layers and the support was sufficient with these methods, and scum resistance was sufficient in the non-image areas. Moreover, there was a case where the mechanical strength of the support (for example, bending strength, fatigue fracture strength or the like) was insufficient with these methods.

Furthermore, if the diameters of fine asperities (pits) produced on the surface of the support were equalized and increased and the depth was increased as conventionally performed, since the image recording layers provided thereon were thickly formed, the pits became the starting points, and local exposure defects or development defects after exposure were likely to occur, which resulted in a defect that dotted residual layers (called dot residual layers) occurred and thereby sensitivity deteriorated.

In the methods (specifications in JP 2001-74171, JP 1-47545 B, JP 8-337835 A, JP 7-197293 A or the like) as exemplified above, if the image recording layers of the types which are exposed with a laser were used, there were similar defects since the image recording layers were thickly formed inevitably in the areas where the image recording layers filled the locally deep recessed areas produced by allowing the intermetallic compounds existent in the aluminum plate to be removed or dropped in graining treatment, as well.

On the other hand, although, in the recent years, in the so-called thermal positive type presensitized plate where the alkali-solubilization of the image recording layers is triggered by generating photothermal conversion in the image recording layers by laser beam irradiation to form a positive image, the means where a surface insoluble-layer to a developer is provided as the outermost layer of the image recording layers is used, if the surface insoluble layer is damaged due to some reason, even the areas which are originally to be the image areas are likely to be dissolved in the developer, and the printing plate is very liable to be scratched in practice. For that reason, since a scratch-like image omission occurs due to subtle contacts such as hitting in handling the printing plates, subtle sliding on an interleaving sheet and touching the printing plate surface with fingers, it is now difficult to handle the printing plates at the time of printing plate working in practice. The scratch-like image omission due to contact or the like is also problematic in the thermal positive type presensitized plate where the image recording layers have no surface insoluble layers, the thermal negative type or other presensitized plates.

In order to improve the aforementioned vulnerability where a scratch easily occurs, it is attempted in the recent years that the surface of the image recording layers is smoothened. In order to realize the flat surface of the image recording layers, it is effective to flatten the surface shape of a support as much as possible. However, if the surface shape of the support is simply flattened, the adhesion between the image recording layers and the support deteriorates, and on the other hand, in the order to secure the adhesion between the image recording layers and the support, if a contact area between the image recording layers and the support is merely increased by the methods such as mechanical graining treatment, asperities are formed on the surface of the image recording layers, and thereby the image recording layers are liable to be scratched.

Therefore, it was very difficult to prevent scratches by flattening the surface of the image recording layers and to secure sufficient printing performance by making the adhesion between the image recording layers and the support excellent simultaneously.

By the way, in the offset lithography as described above, ink is not directly transferred from the printing plate to the impression material such as a printing paper, but the ink is once transferred from a lithographic printing plate wound round a plate cylinder to an elastic rubber cloth (blanket) wound round a transfer cylinder, printing is performed by contacting and pressurizing the blanket to which the ink is transferred and the substrate fed by the impression cylinder.

If the pits in the non-image areas are uneven, since the retention of the fountain solution in the non-image areas is insufficient and the ink is allowed to enter there in the same manner as the edge portions of the aforementioned pits are dissolved, the ink is attached to the non-image areas of the printing plate, thereby causing the scum. The scum is transferred to the blanket and finally appears as the scum of the printed material. In order to prevent the scum of the printed material like this, normally, the scum of the printing plate is prevented by suspending the operation of a printing press to wash away the ink attached to the non-image areas and by increasing the supplied amount of the fountain solution at a time when the scum of the blanket is confirmed. Cleaning is performed by wiping out the entire plate surface, namely, the image areas and the non-image areas with a sponge moistened with the proper amount of an acid or alkali plate cleaner solution. By doing so, the ink attached to the non-image areas on the printing plate is removed.

If the entire printing plate is cleaned with the plate cleaner solution, since the image recording layer is swollen by the cleaner solution, the strength of the image recording layer deteriorates or since the cleaner solution penetrates between the image recording layer and the support, the adhesion therebetween deteriorates. For that reason, if a large number of printing is performed after the printing plate is cleaned, the image recording layer is likely to be worn or exfoliated in the solid image areas whose friction area with the blanket is big or in the highlighted image areas whose contact area with the support is small. Therefore, it is preferable that the lithographic printing plate is excellent in press life even after being cleaned with the plate cleaner solution (referred to as "cleaner press life" in the present invention).

Therefore, the present invention is intended to solve these problems and provide a presensitized plate where 1) the adhesion between the image recording layers and the support is strong, there is no problem that the image recording layers on the edges of the pits are likely to be broken or exfoliated and excellent press life and scum resistance (referred to as "scum resistance" in the present invention) are simultaneously achieved, 2) further, no local exposure defect or no development defect appears and sensitivity is excellent even if a laser exposed type image recording layer is used, 3) in addition, press life is also excellent after printing plate surface is cleaned with a plate cleaner solution, 4) mechanical strength, particularly fatigue fracture strength is excellent and 5) a photosensitive layer is hardly scratched (scratch resistance is excellent) and a support for a lithographic printing plate used for the same. Namely, the present invention is intended to provide a presensitized plate excellent in printing performance (press life, scum resistance, sensitivity and cleaner press life) and handling property (scratch resistance, fatigue fracture strength or the like) when a lithographic printing plate is prepared and a support for a lithographic printing plate used for the same.

Furthermore, the present invention is intended to provide a presensitized plate which has the aforementioned characteristics even if a laser exposed type image recording layer is used and can be treated with a developer containing no alkali metal silicate, a support for a lithographic printing plate used for the same and a method of treating the presensitized plate.

The inventors have thoroughly studied to solve the aforementioned subjects and finally found that if various factors representing the surface shapes obtained with an atomic force microscope are set at the certain ranges and an aluminum plate where the certain composition of foreign metal elements is contained is used, the obtained surface shapes of the support for a lithographic printing plate are preferable ones and the support for a lithographic printing plate is excellent in printing performance (for example, press life, scum resistance, sensitivity, cleaner press life or the like) and handling property (scratch resistance, fatigue fracture strength or the like) when the lithographic printing plate is prepared.

In addition, the inventors have found that the generation of dot residual layers is particularly suppressed and the support for a lithographic printing plate is excellent in sensitivity by defining the number of the deep areas having certain depths existent on the surface of the aforementioned support for a lithographic printing plate.

The inventors have completed the present invention based on the aforementioned findings.

Namely, the present invention provides the following (1) to (8).

(1) A support for a lithographic printing plate obtained by performing graining treatment including electrochemical graining treatment on an aluminum plate, wherein the aluminum plate is an aluminum plate which contains Fe of 0.20 to 0.29 wt %, Si of 0.03 to 0.15 wt %, Cu of 0.020 to 0.040 wt % and Ti of 0.050 wt % or less and whose remaining portion is composed of Al and unavoidable impurities, and wherein surface area ratio and steepness obtained from three-dimensional data by measuring 512×512 points in 5 μm×5 μm on the surface with an atomic force microscope each satisfies the following conditions (i) to (vi):

(i) Surface area ratio $\Delta S^5$ is 30 to 70%;

(ii) Surface area ratio $\Delta S^{5(0.2\text{-}5)}$ is 10 to 30%;

(iii) Surface area ratio $\Delta S^{5(0.02\text{-}0.2)}$ is 30 to 70%;

(iv) Steepness $a45^5$ is 20 to 50%;

(v) Steepness $a45^{5(0.02\text{-}5)}$ is 5 to 20%; and (vi) Steepness $a45^{5(0.02\text{-}0.2)}$ is 20 to 60%, wherein $\Delta S^5$ which is found by the following equation from actual area $S_x^5$ found by approximation three-point method from the three-dimensional data and geometrically measured area $S_0^5$ is surface area ratio expressed by $\Delta S^5=[(S_x^5-S_0^5)/S_0^5]\times 100(\%)$, $\Delta S^{5(0.2\text{-}5)}$ which is found by the following equation from actual area $S_x^{5(0.2\text{-}5)}$ obtained by extracting a component with wavelength of 0.2 μm or longer and 5 μm or shorter from the three-dimensional data and geometrically measured area $S_0^5$ is surface area ratio expressed by $\Delta S^{5(0.2\text{-}5)}=[(S_x^{5(0.2\text{-}5)}-S_0^5)/S_0^5]\times 100(\%)$;

$\Delta S^{5(0.02\text{-}0.2)}$ which is found by the following equation from actual area $S_x^{5(0.02\text{-}0.2)}$ obtained by extracting a component with wavelength of 0.02 μm or longer and 0.2 μm or shorter from the three-dimensional data and geometrically measured area $S_0^5$ is surface area ratio expressed by $\Delta S^{5(0.02\text{-}0.2)}=[(S_x^{5(0.02\text{-}0.2)}-S_0^5)/S_0^5]\times 100(\%)$;

steepness $a45^5$ is an area rate of a portion (area) having a slant with size of angle of 45° or bigger (gradient of 45° or bigger) to actual area $S_x^5$ found by approximation three-point method from the three-dimensional data;

steepness $a45^{5(0.2\text{-}5)}$ is an area rate of a portion (area) having a slant with size of angle of 45° or bigger (gradient of 45° or bigger) to actual area $S_x^{5(0.2\text{-}5)}$ found by extracting a component with wavelength of 0.2 μm or longer and 5 μm or shorter from the three-dimensional data; and steepness $a45^{5(0.02\text{-}0.2)}$ is an area rate of a portion (area) having a slant with size of angle of 45° or bigger (gradient of 45° or bigger) to actual area $S_x^{5(0.02\text{-}0.2)}$ found by extracting a component with wavelength of 0.02 μm or longer and 0.2 μm or shorter from the three-dimensional data.

If each of surface area ratio and steepness described above stays within the range of the present invention, the support for a lithographic printing plate is excellent in sensitivity, press life, scum resistance, and cleaner press life when the lithographic printing plate is prepared.

In addition, if foreign elements contained in the aluminum plate used are specified and the composition is used as a specified one, a preferable surface shape is formed by graining treatment later described.

Particularly, the printing performance and handling property can be each satisfactory at a high level when the lithographic printing plate is prepared by combining the aforementioned surface area ratio, steepness and the contents of the foreign elements contained in the aluminum plate.

(2) A support for a lithographic printing plate obtained by performing graining treatment including electrochemical graining treatment on an aluminum plate, wherein the aluminum plate is an aluminum plate which contains Fe of 0.20 to 0.29 wt %, Si of 0.03 to 0.15 wt %, Cu of 0.020 to 0.040 wt % and Ti of 0.050 wt % or less and whose remaining portion is composed of Al and unavoidable impurities, and wherein surface area ratio and steepness obtained from three-dimensional data by measuring 512×512 points in 50 μm×50 μm on the surface with an atomic force microscope each satisfies the following conditions (xi) to (xvi):

(xi) Surface area ratio $\Delta S^{50}$ is 30 to 70%;

(xii) Surface area ratio $\Delta S^{50(2\text{-}50)}$ is 5 to 10%;

(xiii) Surface area ratio $\Delta S^{50(0.2\text{-}2)}$ is 15 to 40%;

(iv) Steepness $a45^{50}$ is 25 to 60%;

(xv) Steepness $a45^{50(2\text{-}50)}$ is 0 to 3.0%; and (xvi) Steepness $a45^{50(0.2\text{-}2)}$ is 10 to 40%, wherein $\Delta S^{50}$ which is found by the following equation from actual area $S_x^{50}$ found by approximation three-point method from the three-dimensional data and geometrically measured area $S_0^{50}$ is surface area ratio expressed by $\Delta S^{50}=[(S_x^{50}-S_0^{50})/S_0^{50}]\times 100(\%)$, $\Delta S^{50(2\text{-}50)}$ which is found by the following equation from actual area $S_x^{50(2\text{-}50)}$ obtained by extracting a component with wavelength of 2 μm or longer and 50 μm or shorter from the three-dimensional data and geometrically measured area $S_0^{50}$ is surface area ratio expressed by $\Delta S^{50(2\text{-}50)}=[(S_x^{50(2\text{-}50)}-S_0^{50})/S_0^{50}]\times 100(\%)$;

$\Delta S^{50(0.2\text{-}2)}$ which is found by the following equation from actual area $S_x^{50(0.2\text{-}2)}$ obtained by extracting a component with wavelength of 0.2 μm or longer and 2 μm or shorter from the three-dimensional data and geometrically measured area $S_0^{50}$ is surface area ratio expressed by $\Delta S^{50(0.2\text{-}2)}=[(S_x^{50(0.2\text{-}2)}-S_0^{50})/S_0^{50}]\times 100(\%)$;

steepness $a45^{50}$ is an area rate of a portion (area) having a slant with size of angle of 45° or bigger (gradient of 45° or bigger) to actual area $S_x^{50}$ found by approximation three-point method from the three-dimensional data;

steepness $a45^{50(2\text{-}50)}$ is an area rate of a portion (area) having a slant with size of angle of 45° or bigger (gradient of 45° or bigger) to actual area $S_x^{50(2\text{-}50)}$ found by extracting a component with wavelength of 2 μm or longer and 50 μm or shorter from the three-dimensional data; and steepness $a45^{50(0.2\text{-}2)}$ is the area rate of a portion (area) having a slant with size of angle of 45° or bigger (gradient of 45° or bigger) to actual area $S_x^{50(0.2\text{-}2)}$ found by extracting a component with wavelength of 0.2 μm or longer and 2 μm or shorter from the three-dimensional data.

If each of surface area ratio described above stays within the range of the present invention, the support for a lithographic printing plate is excellent in sensitivity, press life, scum resistance, and cleaner press life when the lithographic printing plate is prepared. If each of steepness described above stays within the range of the present invention, the support for a lithographic printing plate is excellent in scum resistance and cleaner press life when the lithographic printing plate is prepared.

In addition, if foreign elements contained in the aluminum plate used are specified and the composition is used as a specified one, a preferable surface shape is formed by graining treatment later described.

Particularly, the printing performance and handling property can be each satisfactory at a high level when the lithographic printing plate is prepared by combining the aforementioned surface area ratio, steepness and the contents of the foreign elements contained in the aluminum plate.

(3) A support for a lithographic printing plate obtained by performing graining treatment including electrochemical graining treatment on an aluminum plate, wherein the aluminum plate is an aluminum plate which contains Fe of 0.20 to 0.29 wt %, Si of 0.03 to 0.15 wt %, Cu of 0.020 to 0.040 wt % and Ti of 0.050 wt % or less and whose remaining portion is composed of Al and unavoidable impurities, wherein surface area ratio and steepness obtained from three-dimensional data by measuring 512×512 points in 5 μm×5 μm on the surface with an atomic force microscope each satisfies the following conditions (i) to (vi), and wherein surface area ratio and steepness obtained from three-dimensional data by measuring 512×512 points in 50 μm×50 μm on the surface with an atomic force microscope each satisfies the following conditions (xi) to (xvi):

(i) Surface area ratio $\Delta S^{5}$ is 30 to 70%;

(ii) Surface area ratio $\Delta S^{5(0.2\text{-}5)}$ is 10 to 30%;

(iii) Surface area ratio $\Delta S^{5(0.02\text{-}0.2)}$ is 30 to 70%;

(iv) Steepness $a45^{5}$ is 20 to 50%;

(v) Steepness $a45^{5(0.2\text{-}5)}$ is 5 to 20%;

(vi) Steepness $a45^{5(0.02\text{-}0.2)}$ is 20 to 60%;

(xi) Surface area ratio $\Delta S^{50}$ is 30 to 70%;

(xii) Surface area ratio $\Delta S^{50(2\text{-}50)}$ is 5 to 10%;

(xiii) Surface area ratio $\Delta S^{50(0.2\text{-}2)}$ is 15 to 40%;

(iv) Steepness $a45^{50}$ is 25 to 60%;

(xv) Steepness $a45^{50(2\text{-}50)}$ is 0 to 3.0%; and (xvi) Steepness $a45^{50(0.2\text{-}2)}$ is 10 to 40%, Here, the significances of the aforementioned conditions (i) to (vi) and the aforementioned conditions (xi) to (xvi) and these functions and effects are as described above.

If each of surface area ratio and steepness described above stays within the range of the present invention, the support for a lithographic printing plate is excellent in sensitivity, press life, scum resistance, and cleaner press life when the lithographic printing plate is prepared.

(4) The support for a lithographic printing plate according to any one of the aforementioned (1) to (3), wherein the number of local deep areas with a depth of 5 μm or more existent on the surface thereof is an average of 1.0 piece or less per 400 μm×400 μm.

If the number of the specified local deep areas existent on the surface of the support for a lithographic printing plate which satisfies each of the surface area ratio and steepness described above is set at the aforementioned range, the generation of dot residual layers can be particularly suppressed for better improvement of sensitivity.

(5) The support for a lithographic printing plate according to any one of the aforementioned (1) to (4), wherein Si atom attached quantity on the surface is 0.1 to 30 mg/m$^2$.

(6) A presensitized plate provided with an image recording layer on the support for a lithographic printing plate according to any one of the aforementioned (1) to (5).

(7) The presensitized plate according to the aforementioned (6), wherein the presensitized is a presensitized plate for a laser printing plate.

(8) A method of treating the presensitized plate, characterized in that after the presensitized plate according to the aforementioned (6) or (7) is exposed, development treatment is performed with a developer substantially containing no alkali metal silicate and containing saccharaides.

DETAILED DESCRIPTION OF THE PREFERRED EMBODIMENTS

Figure 1:
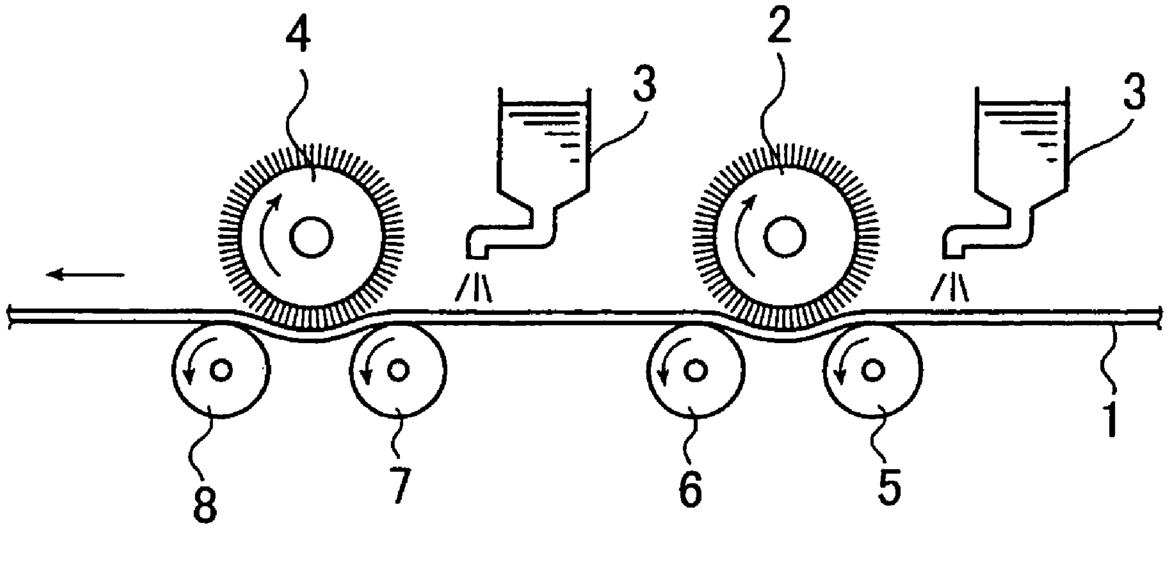
FIG. 1 is a side view showing a process concept of a brush graining treatment used for mechanical graining treatment in the preparation of a support for a lithographic printing plate according to the present invention.

Hereafter, the present invention will be described in detail.

[Support for Lithographic Printing Plate]

<Surface Shape of Support for Lithographic Printing Plate>

The support for a lithographic printing plate according to the present invention is obtained by performing graining treatment later described (including electrochemical graining treatment), preferably anodizing treatment, hydrophilic treatment or the like on an aluminum plate.

The support for a lithographic printing plate according to present invention has a surface where the factors (surface area ratio and steepness) showing a surface shape found with an atomic force microscope satisfy the following ranges.

Namely, (I) a support for a lithographic printing plate according to the present invention is the support for a lithographic printing plate wherein surface area ratio and steepness obtained from three-dimensional data by measuring 512×512 points in 5 μm square (referred to as "5 μm×5 μm" according to the present invention) on the surface with an atomic force microscope each satisfies the following conditions (i) to (vi):

(i) Surface area ratio $\Delta S^5$ is 30 to 70%;

(ii) Surface area ratio $\Delta S^{5(0.2\text{-}5)}$ is 10 to 30%;

(iii) Surface area ratio $\Delta S^{5(0.02\text{-}0.2)}$ is 30 to 70%;

(iv) Steepness $a45^5$ is 20 to 50%;

(v) Steepness $a45^{50(2\text{-}5)}$ is 5 to 20%; and (vi) Steepness $a45^{5(0.02\text{-}0.2)}$ is 20 to 60%, wherein $\Delta S^5$ which is found by the following equation from actual area $S_x^5$ found by approximation three-point method from the three-dimensional data and geometrically measured area $S_0^5$ is surface area ratio expressed by $\Delta S^5=[(S_x^5-S_0^5)/S_0^{50}]\times 100(\%)$, $\Delta S^{5(0.2\text{-}5)}$ which is found by the following equation from actual area $S_x^{5(0.2\text{-}5)}$ obtained by extracting a component with wavelength of 0.2 μm or longer and 5 μm or shorter from the three-dimensional data and geometrically measured area $S_0^5$ is surface area ratio expressed by $\Delta S^{5(0.2\text{-}5)}=[(S_x^{5(0.2\text{-}5)}-S_0^5)/S_0^5]\times 100(\%)$;

$\Delta S^{5(0.02\text{-}0.2)}$ which is found by the following equation from actual area $S_x^{5(0.02\text{-}0.2)}$ obtained by extracting a component with wavelength of 0.02 μm or longer and 0.2 μm or shorter from the three-dimensional data and geometrically measured area $S_0^5$ is surface area ratio expressed by $\Delta S^{5(0.02\text{-}0.2)}=[(S_x^{5(0.02\text{-}0.2)}-S_0^5)/S_0^5]\times 100(\%)$;

steepness $a45^5$ is an area rate of a portion (area) having a slant with size of angle of 45° or bigger (gradient of 45° or bigger) to actual area $S_x^5$ found by approximation three-point method from the three-dimensional data;

steepness $a45^{5(0.2\text{-}5)}$ is an area rate of a portion (area) having a slant with size of angle of 45° or bigger (gradient of 45° or bigger) to actual area $S_x^{5(0.2\text{-}5)}$ found by extracting a component with wavelength of 0.2 μm or longer and 5 μm or shorter from the three-dimensional data; and steepness $a45^{5(0.2\text{-}5)}$ is an area rate of a portion (area) having a slant with size of angle of 45° or bigger (gradient of 45° or bigger) to actual area $S_x^{5(0.02\text{-}0.2)}$ found by extracting a component with wavelength of 0.02 μm or longer and 0.2 μm or shorter from the three-dimensional data.

The support for a lithographic printing plate according to the aforementioned (I) is characterized by the following findings. It is thus considered that the effect of the present invention is exerted as each factor by these findings to one another and the contents of the foreign elements contained in the aluminum plate later described or the like are highly correlated.

In the present invention, the surface area ratio is a factor showing the extent of an increment in an actual area by graining treatment to a geometrically measured area $S_0^5$. If the surface area ratio is increased, a contact area with the image recording layer is increased, and thus, press life can be improved. Here, by increasing the surface area ratio to which a short wavelength component contributes, the contact area between the image recording layer and the support is increased to thereby improve press life and largely suppress the permeability of a cleaner into an clearance between the image recording layer and the support, thus cleaner press life can be improved.

In addition, the inventors have found that if, out of the surface area of a component with wavelength of 5 μm or shorter obtained from the three-dimensional data found by measuring 512×512 points in 5 μm square on the surface of the support, the range of the surface area ratio of wavelength with a component of 0.02 to 0.2 μm is shifted into a big side in a well balanced manner compared with the range of the surface area ratio of a component of 0.2 to 5 μm, a surface shape having a predetermined quantity of a fine structure with a short wavelength of can be obtained, and the plate is excellent in the adhesion between the photosensitive layer and the support in the image areas. It is considered that although scum generally has a tendency to deteriorate if a fine structure is provided on the surface, the tendency is suppressed by balancing the surface area ratio of ΔS in the aforementioned specified area and scum is hardly produced (excellent in scum resistance).

Furthermore, if $\Delta S^{5(0.2\text{-}5)}$ is set to a specified range, development property can be improved by what permeability of a developer is better at the time of development. If $\Delta S^{5(0.02\text{-}0.2)}$ is set to a specified range, since the adhesion between the image recording layer and the surface of the support is moderately kept, the elimination of (the image recording layer of) the exposure area quickly progresses, and elimination defect hardly occurs. As a result, it is considered that sensitivity tends to be improved.

In the present invention, (i) surface area ratio ΔS5 is 30 to 70%. From a viewpoint that the adhesion with the image recording layer can be particularly improved even in the aforementioned improvement effects, $\Delta S^5$ preferable is 40 to 70% and more preferable is 50 to 70%.

(ii) Surface area ratio $\Delta S^{5(0.2\text{-}5)}$ is 10 to 30%, and preferable is 15 to 25% from a viewpoint that sensitivity can be particularly improved while the adhesion with the image recording layer is moderately kept even in the aforementioned improvement effects.

(iii) Surface area ratio $\Delta S^{5(0.02\text{-}0.2)}$ is 30 to 70%. $\Delta S^{5(0.02\text{-}0.2)}$ preferable is 35 to 70% and more preferable is 45 to 70% since $\Delta S^{5(0.02\text{-}0.2)}$ of 70% or higher may cause development defect, and on the other hand, adhesion with the image recording layer is improved even in the aforementioned improvement effects and cleaner press life is particularly improved.

In addition, in the present invention, the steepness in each wavelength range obtained from the three-dimensional data found by measuring 512×512 points in 5 μm squrare is a factor showing the extent of the sharpness of fine shapes on the surface of the support in each wavelength, and concretely, the steepness shows the rate of an area having a slant with size of angle of 45° or bigger to an actual area in asperities on the surface of the support.

The inventors have found out the basis on steepness described below.

Namely, an area of steepness $a45^5$ is important for securing a sufficient water retention capacity even though the attached area of an ink component or a paper powder or the like is existent in the non-image area, by increasing $a45^5$, since a sufficient water capacity can be held and ink spreading can be prevented even if the attached area of an ink component or a paper powder or the like being attached to the grained surface, thus the area of steepness $a45^5$ is excellent in scum resistance. On the other hand, if the steepness is too big, since the area is likely to be a base where ink is caught at the time of printing in the non-image area, the support for a lithographic printing plate may be poor in scum resistance. An area of $a45^{5(0.2\text{-}5)}$ is likely to be a base where ink is caught at the time of printing in the non-image area and is vital to generation of scumming, whereas if $a45^{5(0.2\text{-}5)}$ is decreased, the support for a lithographic printing plate is excellent in scum resistance. Furthermore, the area of $a45^{5(0.02\text{-}0.2)}$ tends to become bigger in association with $\Delta S^{5(0.02\text{-}0.2)}$ to some extent if $\Delta S^{5(0.02\text{-}0.2)}$ is increased. If $a45^{5(0.02\text{-}0.2)}$ is too big, ink is easily caught and difficulty of ink spreading is reduced.

Although it is considered that each of these steepness has the aforementioned functions, it can be also considered that hydrophilicity, water retention property or the like of the whole surface of the support for a lithographic printing plate affects to improve to each other as the whole, and that by adjusting each steepness within the aforementioned specified ranges in a well-balanced manner, cleaner press life, scum resistance and press life can be improved when the lithographic printing plate is prepared.

In the present invention, (iv) steepness $a45^5$ is 20 to 50%. Particularly from a viewpoint that difficulty of ink spreading can be improved in a range which does not badly affect cleaner press life even in the aforementioned improvement effects and the support for a lithographic printing plate is excellent in scum resistance, $a45^5$ preferable is 30 to 45% and more preferable is 30 to 40%.

(v) Steepness $a45^{5(0.2\text{-}5)}$ is 5 to 20%, preferable is 8 to 15% from a viewpoint that scum resistance can be particularly improved even in the aforementioned improvement effects.

(vi) Steepness $a45^{5(0.02\text{-}0.2)}$ is 20 to 60%. From a viewpoint that difficulty of ink spreading can be enhanced and scum resistance can be improved even in the aforementioned improvement effects, $a45^{5(0.02\text{-}0.2)}$ preferable is 20 to 55% and more preferable is 28 to 50%.

Although the aforementioned surface area ratios (i) to (iii) and steepness (iv) to (vi) each tend to improve the characteristics of the presensitized plate and lithographic printing plate, they are more excellent in the improvement effects by satisfying all of them.

Particularly, by combining the contents of foreign elements contained in the aforementioned factors and the aluminum plate later described, the support for a lithographic printing plate is significantly excellent in these improvement effects, and printing performance and handling property can be each satisfied at a high level when the lithographic printing plate is prepared.

(II) A support for a lithographic printing plate according to the present invention is the support for a lithographic printing plate wherein surface area ratio and steepness obtained from three-dimensional data by measuring 512×512 points in 50 μm square (referred to as "50 μm×50 μm" according to the present invention) on the surface with an atomic force microscope each satisfies the following conditions (xi) to (xvi):

(xi) Surface area ratio $\Delta S^{50}$ is 30 to 70%;

(xii) Surface area ratio $\Delta S^{50(2\text{-}50)}$ is 5 to 10%;

(xiii) Surface area ratio $\Delta S^{50(0.2\text{-}2)}$ is 15 to 40%;

(iv) Steepness $a45^{50}$ is 25 to 60%;

(xv) Steepness $a45^{50(2\text{-}50)}$ is 0 to 3.0%; and (xvi) Steepness $a45^{50(0.2\text{-}2)}$ is 10 to 40%, wherein $\Delta S^{50}$ which is found by the following equation from actual area $S_x^{50}$ found by approximation three-point method from the three-dimensional data and geometrically measured area $S_0^{50}$ is surface area ratio expressed by $\Delta S^{50}=[(S_x^{50}-S_0^{50})/S_0^{50}]\times100(\%)$, $\Delta S^{50(2\text{-}50)}$ which is found by the following equation from actual area $S_x^{50(2\text{-}50)}$ obtained by extracting a component with wavelength of 2 μm or longer and 50 μm or shorter from the three-dimensional data and geometrically measured area $S_0^{50}$ is surface area ratio expressed by $\Delta S^{50(2\text{-}50)}=[(S_x^{50(2\text{-}50)}-S_0^{50})/S_0^{50}]\times100(\%)$;

$\Delta S^{50(0.2\text{-}2)}$ which is found by the following equation from actual area $S_x^{50(0.2\text{-}2)}$ obtained by extracting a component with wavelength of 0.2 μm or longer and 2 μm or shorter from the three-dimensional data and geometrically measured area $S_0^{50}$ is surface area ratio expressed by $\Delta S^{50(0.2\text{-}2)}=[(S_x^{50(0.2\text{-}2)}-S_0^{50})/S_0^{50}]\times100(\%)$;

steepness $a45^{50}$ is an area rate of a portion (area) having a slant with size of angle of 45° or bigger (gradient of 45° or bigger) to actual area $S_x^{50}$ found by approximation three-point method from the three-dimensional data;

steepness $a45^{50(2\text{-}50)}$ is an area rate of a portion (area) having a slant with size of angle of 45° or bigger (gradient of 45° or bigger) to actual area $S_x^{50(2\text{-}50)}$ found by extracting a component with wavelength of 2 μm or longer and 50 μm or shorter from the three-dimensional data; and steepness $a45^{50(0.2\text{-}2)}$ is the area rate of a portion (area) having a slant with size of angle of 45° or bigger (gradient of 45° or bigger) to actual area $S_x^{50(0.2\text{-}2)}$ found by extracting a component with wavelength of 0.2 μm or longer and 2 μm or shorter from the three-dimensional data.

The support for a lithographic printing plate according to the aforementioned (II) is characterized by the following findings. It is thus considered that the effect of the present invention is exerted as each factor by these findings to one another and the contents of the foreign elements contained in the aluminum plate later described or the like are highly correlated.

In the present invention, the surface area ratio is a factor showing the extent of an increment in an actual area by graining treatment to a geometrically measured area $S_0^{50}$. If the surface area is increased, a contact area with the image recording layer is increased, and thus, press life can be improved. Here, by increasing the surface area ratio to which a long wavelength component contributes, the contact area between the image recording layer and the support is increased to thereby improve press life and largely suppress the permeability of a cleaner into an clearance between the image recording layer and the support, thus cleaner press life can be improved.

The inventors have found out the basis on the surface area ratio described below.

Namely, if surface area ratio $\Delta S^{50}$ stays within the range of the present invention, since water quantity held in the asperities is increased, and hydrophilicity and water retention property can be improved, ink spreading in the halftone dot areas can be suppressed, the support for a lithographic printing plate is excellent in scum resistance. In addition, if $\Delta S^{50(2\text{-}50)}$ stays within the range of the present invention, the image recording layer provided thereon is also formed in profile irregular shape along the profile irregular structures, ink can be easily stored in the recess of the profile irregular shape. In such a case, even if the support for a lithographic printing plate is pressed (pressurized) by the blanket cylinder, since the movement of the ink can be absorbed, the widening of the ink is suppressed and ink spreading can be also suppressed. Furthermore, even if the deposit of the ink component, paper powder or the like is attached to the grained surface, a sufficient water capacity can be kept, and the support for a lithographic printing plate is also excellent in scumming. Namely, scum resistance can be improved. In addition, if surface area ratio $\Delta S^{50(0.2\text{-}2)}$ stays within the range of the present invention, since the image recording layer provided thereon can be completely removed in development treatment and hydrophilicity is improved, ink spreading hardly occurs in the halftone dot areas, and the support for a lithographic printing plate is excellent in scum resistance.

In addition, $\Delta S^{50}$ is too big, locally sharp salients are formed and the film thickness of the image recording layer provided on the area is too thin, and the support for a lithographic printing plate and the presensitized plate tend to be poor in scratch resistance. Furthermore, if $\Delta S^{50(0.2\text{-}2)}$ is set to the specified range, the film thickness of the image recording layer is easily uniform, and thereby exposure stability is increased and the support for a lithographic printing plate is excellent in sensitivity.

Although it is considered that surface area ratios $\Delta S^{50}$, $\Delta S^{50(2\text{-}50)}$ and $\Delta S^{50(0.2\text{-}2)}$ have the functions as described above, it is considered that they mutually affect and contribute to the improvement of water retention property, hydrophilicity or the like of the support for a lithographic printing plate as a whole. In addition, if the aforementioned surface area ratios stay within the range of the present invention, the surface area of the support is increased, the adhesion with the image recording layer is strengthened, and thus cleaner press life and press life can be improved.

Therefore, by adjusting each of these surface area ratios $\Delta S^{50}$, $\Delta S^{50(2\text{-}50)}$ and $\Delta S^{50(0.2\text{-}2)}$ in the aforementioned specified ranges in a well-balanced manner, cleaner press life, press life, scum resistance or the like can be improved.

In the present invention, (xi) surface area ratio $\Delta S^{50}$ is 30 to 70%. From a viewpoint that press life and difficulty of ink spreading can be particularly improved even in the aforementioned improvement effects and the support for a lithographic printing plate is excellent in scum resistance, $\Delta S^{50}$ preferable is 35 to 70% and more preferable is 40 to 60%.

(xii) Surface area ratio $\Delta S^{50(2\text{-}50)}$ is 5 to 10%, preferable is 6 to 8% from a viewpoint that difficulty of ink spreading can be particularly improved even in the aforementioned improvement effects and the support for a lithographic printing plate is excellent in scum resistance.

(xiii) Surface area ratio $\Delta S^{5(0.2\text{-}2)}$ is 15 to 40%. From a viewpoint that sensitivity and press life are both enhanced even in the aforementioned improvement effects, $\Delta S^{5(0.2\text{-}2)}$ preferable is 16 to 40% and more preferable is 20 to 35%.

In addition, in the present invention, the steepness in each wavelength range obtained from the three-dimensional data found by measuring 512×512 points in 50 μm square is a factor showing the extent of the sharpness of fine shapes on the surface of the support in each wavelength, and concretely, the steepness shows the rate of an area having a slant with size of angle of 45° or bigger to an actual area in asperities on the surface of the support.

The inventors have found out the basis on steepness described below.

Namely, the area $a45^{50}$ is important for securing hydrophilicity and water retention property and enhancing scum resistance, water retention property can be improved while keeping scum resistance by staying $a45^{50}$ within the range of the present invention, and thus both ink spreading and scumming in the halftone dot areas can be enhanced. If the $a45^{50}$ is too big, sharp salients are locally formed, the film thickness of the image recording layer provided on the areas is too thin, and thus the presensitized plate tends to be poor in scratch resistance. In addition, although the area of $a45^{50(2\text{-}50)}$ is important for preventing the outflow of the fountain solution existent in the non-image area by functioning as a so-called bowl edge in the non-image area, particularly for securing a sufficient water retention capacity even though the attached area of ink component, paper powder or the like is existent in the non-image area, since scum resistance may deteriorate if the value is too big, it is important to take an appropriate value. In addition, the area of $a45^{50(0.2\text{-}2)}$ is likely to be a base where ink is caught at the time of printing in the non-image area and is vital for the cause of occurrence of scumming or the like, whereas if $a45^{50(0.2\text{-}2)}$ is decreased, the support for a lithographic printing plate is excellent in scum resistance.

Although it is considered that each of these steepness has the aforementioned functions, it can be also considered that hydrophilicity, water retention property or the like of the whole surface of the support for a lithographic printing plate affects to improve to each other as the whole, and that by adjusting each steepness within the aforementioned specified ranges in a well-balanced manner, cleaner press life and scum resistance or the like can be improved when the lithographic printing plate is prepared.

In the present invention, (xiv) steepness $a45^{50}$ is 25 to 60%, and preferable is 30 to 55% from a viewpoint that the support for a lithographic printing plate is particularly excellent in both scum resistance and scratch resistance even in the aforementioned improvement effects.

(xv) Steepness $a45^{50(2\text{-}50)}$ is 0 to 3.0%. From a viewpoint that the support for a lithographic printing plate is particularly excellent in scum resistance even in the aforementioned improvement effects, $a45^{50(2\text{-}50)}$ preferable is 0.1 to 2.0% and more preferable is 0.1 to 1.0%.

(xvi) Steepness $a45^{50(0.2\text{-}2)}$ is 10 to 40%. From a viewpoint that the support for a lithographic printing plate is particularly excellent in scum resistance even in the aforementioned improvement effects, $a45^{50(0.2\text{-}2)}$ preferable is 13 to 35% and more preferable is 15 to 35%.

Although the aforementioned surface area ratios (xi) to (xiii) and steepness (xiv) to (xvi) each tend to improve the characteristics of the presensitized plate and lithographic printing plate, they are more excellent in the improvement effects by satisfying all of them.

Particularly, by combining the contents of foreign elements contained in the aforementioned factors and the aluminum plate later described, the support for a lithographic printing plate is significantly excellent in these improvement effects, and printing performance and handling property can be each satisfied at a high level when the lithographic printing plate is prepared.

(III) A support for a lithographic printing plate according to the present invention is the support for a lithographic printing plate wherein surface area ratio and steepness obtained from three-dimensional data by measuring 512×512 points in 5 μm square on the surface with an atomic force microscope each satisfies the following conditions (i) to (vi), and wherein surface area ratio and steepness obtained from three-dimensional data by measuring 512×512 points in 50 μm square on the surface with an atomic force microscope each satisfies the following conditions (xi) to (xvi):

(i) Surface area ratio $\Delta S^{5}$ is 30 to 70%;
(ii) Surface area ratio $\Delta S^{5(0.2\text{-}5)}$ is 10 to 30%;
(iii) Surface area ratio $\Delta S^{5(0.02\text{-}0.2)}$ is 30 to 70%;
(iv) Steepness $a45^{5}$ is 20 to 50%;
(v) Steepness $a45^{5(0.2\text{-}5)}$ is 5 to 20%;
(vi) Steepness $a45^{5(0.02\text{-}0.2)}$ is 20 to 60%;
(xi) Surface area ratio $\Delta S^{50}$ is 30 to 70%;
(xii) Surface area ratio $\Delta S^{50(2\text{-}50)}$ is 5 to 10%;
(xiii) Surface area ratio $\Delta S^{50(0.2\text{-}2)}$ is 15 to 40%;
(iv) Steepness $a45^{50}$ is 25 to 60%;

(xv) Steepness $a45^{50(2-50)}$ is 0 to 3.0%; and (xvi) Steepness $a45^{50(0.2-2)}$ is 10 to 40%, Here, the significances of the aforementioned conditions (i) to (vi) and the aforementioned conditions (xi) to (xvi) and these functions and effects are as described above.

Although the aforementioned surface area ratios and steepness each tend to improve the characteristics of the presensitized plate and the lithographic printing plate as described above, by satisfying all the aforementioned conditions (i) to (vi) and the aforementioned conditions (xi) to (xvi), namely, by adjusting the surface area ratio to which the component with a long wavelength and the component with a short wavelength contribute and the steepness of the component with a long wavelength and the component with a short wavelength in the aforementioned ranges in a well-balanced manner, since the surface area of the support for a lithographic printing plate can be increased as a whole, hydrophilicity and water retention property of the support can be improved even more, the support for a lithographic printing plate is excellent in scum resistance, press life, cleaner press life or the like when the lithographic printing plate is prepared.

Particularly, by combining the contents of foreign elements contained in the aluminum plate later described in the aforementioned factors, the support for a lithographic printing plate is significantly excellent in these improvement effects and printing performance, and handling property can be each satisfied at a high level when the lithographic printing plate is prepared.

The preferable ranges of each condition are the same as in the aforementioned ones.

It is preferable that for the support for a lithographic printing plate according to the present invention, the number of local depth with a depth of 5 μm or more existent on the surface thereof is an average of 1.0 piece or less per 400 μm×400 μm.

As described above, if deep and big recessed areas (deep areas) are formed to improve water retention property and hydrophilicity of the lithographic printing plate, it may cause the occurrence of dot residual layers or the like to deteriorate sensitivity. However, if the number of the aforementioned depth is set to the aforementioned range, the presensitized plate obtained from the support for a lithographic printing plate satisfying the factors representing the aforementioned surface shape does not produce dot residual layers even though the conditions of exposure and development are severe, the presensitized plate is more excellent in sensitivity.

It is preferable that the number of the aforementioned depths is an average of 0.8 pcs or less per 400 μm×400 μm from a viewpoint that sensitivity can be further enhanced and particularly preferable that the number of the aforementioned depth is 0.5 pcs or less.

In order to form the surface shape like this, for example, taken up are a method that the sum of quantity of electricity participating in the anodic reaction in electrolytic graining treatment using an electrolytic solution mainly containing nitric acid is increased, a method that mechanical graining treatment is performed with a brush roll and a abrasive having a specified median diameter, or the like.

The inventors herein have thoroughly studied the cause of the generation of deep areas with a depth of 5 μm or more by graining treatment later described and estimated the cause as follows:

First, if graining treatment including mechanical graining treatment is performed, the edge areas of abrasive particles used for mechanical graining treatment are deeply stuck into the surface of an aluminum plate to form deep areas.

Second, if graining treatment including electrolytic graining treatment is performed, a current is concentrated on a specific area when electrolytic graining treatment is performed.

The inventors herein have thus estimated the causes, thoroughly studied the matter and found that the number of deep areas with a depth of 5 μm or more produced by graining treatment can be 1.0 per 400 μm×400 μm or less by the countermeasures mentioned below.

Namely, the following countermeasures (1) to (5) are found to sticking of the abrasive particles used for mechanical graining treatment which is the first cause.

(1) Use of Abrasive of Small Particle Diameter

For example, the big size particles of the abrasive are removed by settling, and only the small size particles are used, and the particle size of the abrasive can be reduced by allowing the particles of the abrasive to contact with each other to be worn by re-crushing.

(2) Use of Abrasive of Particles with Small Number of Points

Pumice stone (hereinafter, also called “pumice”) usually used for mechanical graining treatment is obtained by crushing volcanic ashes, and the particles are plate fragments like broken glasses and the edge areas are sharp. On the contrary, silica sand is of a shape closer to 12-hedron or 24-hedron and is not sharp.

(3) Use of Softer Brush Bristles for Mechanical Graining Treatment

For example, a brush with thinner diameter of bristles is used or a brush made of a soft material is used to allow brush bristles to be soft.

(4) The Revolution of the Brush used for Mechanical Graining Treatment is Lowered.

Sticking is suppressed by moderately giving “escape” time to the abrasive particles contained in a slurry solution.

(5) Pressing Pressure (Load) of the Brush used for Mechanical Graining Treatment is Lowered.

In addition, the following countermeasures (6) have been found to the concentration of the current on the specific area when electrolytic graining treatment is performed which is the second cause.

(6) An Electrolyte Mainly Containing Nitric Acid is used in Electrolytic Graining Treatment, Cu Content is Lowered in the Alloy Components of the Aluminum Plate so as to Allow Electrolysis to be Evenly Generated.

In electrolytic graining treatment, usually, by applying AC to an acidic electrolyte, the dissolution reaction of aluminum (pitting reaction) and smut attachment reaction where components produced after the dissolution attaches to the dissolution reaction area alternately take place in accordance with the cycle of AC. Here, if a nitric acid electrolyte is used, the reaction is likely to be affected by the kinds or quantity of aluminum alloy components contained in the aluminum plate, particularly, the affect by Cu is big. It is considered that this is because the surface resistance increases when electrolytic graining treatment is performed in the presence of Cu. Therefore, since the surface resistance decreases when electrolytic graining treatment is performed by setting Cu content in the alloy components to be 0.040 wt % or less, the concentration of the current is suppressed, enabling to form even pits on the entire surface without forming too big pits.

Next, the methods of measuring each condition (factor) as aforementioned will be described.

In the support for a lithographic printing plate according to the present invention, the methods of finding each surface area ratio, each steepness and the number of the local depths are as follows:

(1) Measurement of Surface Area Ratio and Steepness (i) to (vi) with Atomic Force Microscope In the present invention, the surface area ratio is measured with the atomic force microscope (AFM) to find a three-dimensional data. Described below is the concrete procedure.

A piece of 1 cm square in size is cut off from the support for the lithographic printing plate, the piece is set at the horizontal specimen block on the piezo scanner, a cantilever is allowed to approach the surface of the specimen for the cantilever to reach an area where an atomic force works, and then scanning is performed in XY directions. In this case, the asperities of the specimen are captured as the piezo scanner's displacement in Z direction. The piezo scanner capable of scanning in 150 μm in XY directions and 10 μm in Z direction is used. The cantilever with resonance frequency of 120 to 400 kHz and spring constant of 12 to 90 N/m (SI-DF20, made by Seiko Instruments Inc., NCH-10, made by NANOSENSORS INC., or AC-160TS made by Olympus Co., Ltd.,) is used, and the measurement is performed in DMF mode (dynamic force mode). In addition, the subtle slant of the specimen is compensated by the least square estimate of the found three-dimensional data to find a reference plane.

The 512×512 points in 5 μm square on the surface are measured. The resolution in XY directions is set to 0.01 μm, the resolution in Z direction to 0.15 nm, and the scanning velocity to 5 μm/sec.

In order to calculate (i) $\Delta S^5$, the three-dimensional data (f (x, y)) obtained in the aforementioned (1) is used intact, the adjacent three points are extracted, the sum of the area of a fine triangle formed by the three points is found and is determined to be an actual area $S_x^5$. Surface area ratio $\Delta S^5$ is found by the following equation from the obtained actual area $S_x^5$ and geometrically measured area $S_0^5$. Here, $S_0^5$ is 5×5 μm².

$$\Delta S^5 = [(S_x^5 - S_0^5)/S_0^5] \times 100(\%)$$

In order to calculate (iv) $a45^5$, the three-dimensional data (f (x, y)) obtained in the aforementioned (1) is used intact to calculate an angle met by a fine triangle formed by the three points of each reference point and the adjacent two points in a predetermined direction (for example, the right and lower) and a reference plane relative to each reference point. The number of the reference points with gradient of 45° or more in the fine triangles is divided by the number of all the reference points (the number that the number of the points where the two adjacent points in a predetermined direction lack is deducted from 512×512 points which are the number of all the data, that is, 511×511 points) to calculate the surface area ratio $a45^5$ of an area with gradient of 45° or bigger.

In order to calculate (ii) $\Delta S^{5(0.2-5)}$, a component with wavelength of 0.2 μm or longer and 5 μm or shorter extracted from the three-dimensional data obtained by the aforementioned (1) is used. In order to extract the component with wavelength of 0.2 μm or longer and 5 μm or shorter, a frequency distribution is found by performing fast Fourier transform on the three-dimensional data obtained by the aforementioned (1), subsequently, after a component with wavelength of less than 0.2 μm is removed, an extraction is made by performing Fourier inverse transform.

The three-dimensional data (f (x, y)) obtained described above is used to extract the three adjacent points, the sum of the areas of the fine triangles formed by the three points is found and is determined to be actual area $S_x^{5(0.2-5)}$. Surface area ratio $\Delta S^{5(0.2-5)}$ is found by the following equation from actual area $S_x^{5(0.2-5)}$ and geometrically measured area $S_0^5$.

$$\Delta S^{5(0.2-5)} = [(S_x^{5(0.2-5)} - S_0^5)/S_0^5] \times 100(\%)$$

In order to calculate (v) $a45^{5(0.2-5)}$, the three-dimensional date (f (x, y)) found by performing Fourier inverse transform by the aforementioned (ii) is used to calculate $a45^{5(0.2-5)}$, in the same calculation as in the aforementioned (iv) $a45^5$.

In order to calculate (iii) $\Delta S^{5(0.02-0.2)}$, a component with wavelength of 0.02 μm or longer and 0.2 μm or shorter extracted from the three-dimensional data obtained by the aforementioned (1) is used. In order to extract the component with wavelength of 0.02 μm or longer and 0.2 μm or shorter, a frequency distribution is found by performing fast Fourier transform on the three-dimensional data obtained by the aforementioned (1), subsequently, after a component with wavelength of less than 0.02 μm and more than 0.2 μm is removed, an extraction is made by performing Fourier inverse transform.

The three-dimensional data (f (x, y)) obtained described above is used to extract the three adjacent points, the sum of the areas of the fine triangles formed by the three points is found and is determined to be actual area $S_x^{5(0.02-0.2)}$. Surface area ratio $\Delta S^{5(0.02-0.2)}$ is found by the following equation from actual area $S_x^{5(0.02-0.2)}$ and geometrically measured area $S_0^5$.

$$\Delta S^{5(0.02-0.2)} = [(S_x^{5(0.02-0.2)} - S_0^5)/S_0^5] \times 100(\%)$$

In order to calculate (vi) $a45^{5(0.02-0.2)}$, the three-dimensional date (f (x, y)) obtained by performing Fourier inverse transform by the aforementioned (iii) is used to calculate surface area ratio $a45^{5(0.02-0.2)}$), of the area with gradient of 45° or more in the same calculation as in the aforementioned (iv) $a45^5$.

(2) Measurement of Surface Area Ratio and Steepness (xi) to (xvi) with Atomic Force Microscope (AFM)

The surface shape is measured with AFM to find the three-dimensional data in the same manner as in the aforementioned (1).

However, measurement is performed on 512×512 points in 50 μm square on the surface. The resolution of XY direction is determined to be 0.1 μm, the resolution of Z direction is determined to be 0.15 nm and scanning rate is 50 μm/sec.

In order to calculate (Xi) $\Delta S^{50}$, the three-dimensional data (f (x, y)) obtained in the aforementioned (2) is used intact, the adjacent three points are extracted, the sum of the area of a fine triangle formed by the three points is found and is determined to be an actual area $S_x^{50}$. Surface area ratio $\Delta S^{50}$ is found by the following equation from the obtained actual area $S_x^{50}$ and geometrically measured area $S_0^{50}$. Here, $S_0^{50}$ is 50×50 μm².

$$\Delta S^{50} = [(S_x^{50} - S_0^{50})/S_0^{50}] \times 100(\%)$$

In order to calculate (xiv) $a45^{50}$, the three-dimensional data (f (x, y)) obtained in the aforementioned (2) is used intact to calculate an angle met by a fine triangle formed by the three points of each reference point and the adjacent two points in a predetermined direction (for example, the right and lower) and a reference plane relative to each reference point. The number of the reference points with gradient of 45° or more in the fine triangles is divided by the number of all the reference points (the number that the number of the points where the two adjacent points in a predetermined direction lack is deducted from 512×512 points which are the number of all the data, that is, 511×511 points) to calculate the surface area ratio $a45^{50}$ of an area with gradient of 45° or bigger.

In order to calculate (xii) $\Delta S^{50(2-50)}$, a component with wavelength of 2 μm or longer and 50 μm or shorter extracted from the three-dimensional data obtained by the aforementioned (2) is used. In order to extract the component with wavelength of 2 μm or longer and 50 μm or shorter, a frequency distribution is found by performing fast Fourier transform on the three-dimensional data obtained by the aforementioned (2), subsequently, after a component with wavelength of less than 2 μm is removed, an extraction is made by performing Fourier inverse transform.

The three-dimensional data (f (x, y)) obtained described above is used to extract the three adjacent points, the sum of the areas of the fine triangles formed by the three points is found and is determined to be actual area $S_x^{50(2-50)}$. Surface area ratio $\Delta S^{50(2-50)}$ is found by the following equation from actual area $S_x^{50(2-50)}$ and geometrically measured area $S_0^{50}$.

$$\Delta S^{50(2-50)}=[(S_x^{50(2-50)}-S_0^{50})/S_0^{50}]\times 100(\%)$$

In order to calculate (xv) $a45^{50(2-50)}$, the three-dimensional date (f (x, y)) found by performing Fourier inverse transform by the aforementioned (xii) is used to calculate $a45^{50(2-50)}$, in the same calculation as in the aforementioned (xiv) $a45^{50}$.

In order to calculate (xiii) $\Delta S^{50(0.2-2)}$, a component with wavelength of 0.2 μm or longer and 2 μm or shorter extracted from the three-dimensional data obtained by the aforementioned (2) is used. In order to extract the component with wavelength of 0.2 μm or longer and 2 μm or shorter, a frequency distribution is found by performing fast Fourier transform on the three-dimensional data obtained by the aforementioned (2), subsequently, after a component with wavelength of less than 0.2 μm and more than 2 μm is removed, an extraction is made by performing Fourier inverse transform.

The three-dimensional data (f (x, y)) obtained described above is used to extract the three adjacent points, the sum of the areas of the fine triangles formed by the three points is found and is determined to be actual area $S_x^{50(0.2-2)}$. Surface area ratio $\Delta S^{50(0.2-2)}$ is found by the following equation from actual area $S_x^{50(0.2-2)}$ and geometrically measured area $S_0^{50}$.

$$\Delta S^{50(0.2-2)}=[(S_x^{50(0.2-2)}-S_0^{50})/S_0^{50}]\times 100(\%)$$

In order to calculate (xvi) $a45^{50(0.2-2)}$, the three-dimensional date (f (x, y)) obtained by performing Fourier inverse transform by the aforementioned (xiii) is used to calculate surface area ratio $a45^{50(0.2-2)}$, of the area with gradient of 45° or more in the same calculation as in the aforementioned (xiv) $a45^{50(0.2-2)}$.

(3) Measurement of Number of Local Deep Areas with a Depth of 5 μm or more Existent on the Surface 400 μm square on the surface is scanned in a non-contact manner at resolution of 0.01 μm with a laser microscope to obtain the three-dimensional data, and the local deep areas with a depth of 5 μm or more are counted based on the three-dimensional data. The same procedure is performed on 5 to 10 positions and the average value of the counts is considered to be the number of the aforementioned local deep areas.

<Aluminum Plate (Rolled Aluminum)>

The preparation of the support for a lithographic printing plate according to the present invention having factor representing a surface shape uses an aluminum alloy. The essential alloy components in the aluminum alloy are Al, Fe, Si and Cu, and Ti is preferably contained.

Fe of about 0.04 to 0.2 wt % is usually contained in an aluminum alloy (Al base metal) used as a raw material. A quantity of Fe which is solid-solved in aluminum is small and most of the quantity remains as an intermetallic compound. Fe has a function to increase the mechanical strength of an aluminum alloy and greatly affects the strength of a support for lithographic printing plate. If the content of Fe is too low, since the mechanical strength is too small, the mechanical strength of an aluminum alloy is excessively reduced and, accordingly, a support for lithographic printing plate, which is made of the alloy, may be inferior in the strength upon repeated bending (bending strength) and the property of being less liable to fracture when repeatedly bent with minute amplitudes (fatigue fracture strength). In addition, plate-tear is likely to take place when a lithographic printing plate is mounted on the plate cylinder of a printing press. In addition, when a massive printing is performed at a high speed, plate-tear is likely to occur similarly. On the other hand, if the content of Fe is too high, the printing plate is highly hardened, the printing plate is poor in fitness when a lithographic printing plate is mounted on the plate cylinder of a printing press, and plate-tear is likely to occur during printing. In addition, if the content of Fe is, for example, higher than 1.0 wt % or more, cracking is likely to take place during the rolling of the lithographic printing plate.

The inventors have found that the intermetallic compounds containing Fe later described largely occupy the intermetallic compounds contained in the aluminum plate, and that they are easily removed (easily dropped) in graining treatment, and this removal of the compounds causes defective exposure and defective development by allowing the image recording layer to enter local recesses formed after they are removed (dropped).

Namely, Fe contained in an aluminum plate is likely to form intermetallic compounds with aluminum as described above, and these intermetallic compounds are important as a starting point of pit formation in electrolytic graining treatment. The intermetallic compounds are likely to be removed or dropped from the surface of the aluminum plate when electrolytic graining treatment or the like is performed, and big and deep recesses are formed on the surface of the aluminum plate after the intermetallic compounds are removed (or dropped). If a presensitized plate is prepared by providing an image recording layer on the surface of a support having the recesses like this, the provided image recording layer fills the recesses and the image recording layer is thickened in the areas. If so, exposure energy can not sufficiently reach the bottom of the recesses at the time of exposure (defective exposure occurs), the image recording layer can not be efficiently removed by development treatment (defective development occurs), since the image recording layer is left in the recesses, dot residual layers or the like may be produced, thereby deteriorating sensitivity.

The inventors have found that the formation of the deep recesses generated by the dropping of the intermetallic compounds in an electrolytic graining treatment or the like can be suppressed to prevent defective exposure and defective development by controlling the pieces and the occupation rate of the intermetallic compounds on the surface of the aluminum plate in the aforementioned specific range and that a presensitized plate suitable for particularly, plate making which uses a laser light source can be obtained.

In the present invention, based on the aforementioned findings or the like, the quantity of the intermetallic compounds containing Fe becomes smaller by setting the upper limit of Fe content at 0.29 wt %, since the local deep areas formed after the intermetallic compounds are removed (dropped) are reduced, neither defective exposure nor defective development being likely to occur and sensitivity is excellent. In addition, the support for a lithographic printing plate is excellent in mechanical strength by setting the upper limit of Fe content at the range.

Although it is appropriate to set a lower limit of Fe content at 0.05 wt % or more considering the content of Fe in the base metal, it is more preferable that the lower limit is set at 0.20 wt % or more to keep the mechanical strength.

Representative examples as the intermetallic compounds containing Fe are $Al_3Fe$, $Al_6Fe$, AlFeSi-type compounds, AlFeSiMn-type compounds or the like.

Si is an element of about a 0.03 to 0.1 wt % unavoidable impurity contained in an aluminum base metal which is a raw material, and there are many cases where a trace of the element is intentionally added to prevent the dispersion by the difference in raw materials. In addition, Si is an element which is much contained in a scrap aluminum. Si is existent in a state where it is solid-solved in Al or in the form of an intermetallic compound or a simple deposit. In addition, if the element is heated in the preparing process of the support for a lithographic printing plate, the solid-solved Si may be deposited as a chemical element of Si. According to the findings of the inventors, if a chemical element of Si is excessive, severe ink scum resistance may deteriorate. Here, “severe ink scum” means a scum that if printing is performed while it is suspended many times, ink is likely to be easily attached to the surface area of a lithographic printing plate, which results in appearing a dot or circular scum on a printed paper or the like. In addition, the content of Si affects electrolytic graining treatment.

Furthermore, if the content of Si is high, an anodizing layer becomes defective when anodizing treatment is performed after graining treatment, the water retaining property of the defective areas is poor, thereby paper is likely to be fouled at the time of printing.

In the present invention, the content of Si is 0.03 wt % or more and is 0.15 wt % or lower. It is preferably 0.04 wt % or more and is 0.1 wt % or lower in that the stability of electrolytic graining treatment is excellent.

Cu is a very important element in controlling electrolytic graining treatment and is an essential component in the present invention. Since the diameters of pits produced by electrolytic graining treatment in a nitric acid solution can be made higher by setting the content of Cu at 0.020 wt % or more, water retention of fountain solution in the non-image areas can be largely secured when printing is performed after exposure and development, thereby scum resistance is improved. On the other hand, if the content of Cu is too high, since the diameters of pits produced by electrolytic gaining treatment in a nitric acid solution are too big and the uniformity of the diameters deteriorates, scum resistance is particularly poor. Thereby the upper limit of Si content is set at 0.040 wt % in the present invention.

In addition, the inventors have found that the pits with diameters of 0.5 μm or less produced by electrolytic graining treatment in a hydrochloric acid solution can be equalized and the increment rate of the surface area on the surface of the support can be maximized by setting the content of Cu in this range. Since the contact area with the image recording layer can be made bigger by increasing the increment rate of the surface area, the adhesion on the areas is improved, thereby the printing plate is excellent in printing performance. In addition, scum resistance is excellent when a lithographic printing plate is prepared.

In the present invention, from the aforementioned viewpoint, the content of Cu is 0.020 to 0.040 wt %, and preferable is 0.020 to 0.030 wt %.

Conventionally, Ti of 0.050 wt % or less is usually contained as a crystal fining material to make a crystal structure fine. If the content of Ti is too high, since the resistance of the surface anodized layers in electrolytic graining treatment, particularly, in electrolytic graining treatment in a nitric acid aqueous solution becomes too small, uniform pits may not be formed. In the present invention, the content of Ti is 0.050 wt % or less and preferable is 0.030 wt % or less.

In addition, Ti may not be contained in an aluminum plate, and although the content may be low, it is preferable that the content of Ti is 0.005 wt % or more to increase a crystal fining effect, and more preferable is 0.01 wt % or more.

Although Ti is mainly added as an intermetallic compound with Al or $TiB_2$, it is preferable that Ti is added as an Al—Ti alloy or an Al—B—Ti alloy to increase the crystal fining effect. Note that if Ti is added as the Al—B—Ti alloy, a trace of B is contained in an aluminum alloy. However, the effect of the present invention is not damaged.

The remaining portion of the aluminum plate is composed of aluminum and unavoidable impurities. Most of the unavoidable impurities is contained in an aluminum base metal. If the unavoidable impurities are contained, for example, in the base metal of aluminum purity of 99.7%, the effect of the present invention is not damaged. For unavoidable impurities, impurities of amounts described, for example, in “Aluminum Alloys: Structure and Properties” authored by L. F. Mondolfo (1976) or the like may be contained.

Unavoidable impurities contained in an aluminum alloy includes, for example, Mg, Mn, Zn, Cr or the like, and these elements of 0.05 wt % or less may be each contained. For other elements than these elements, the contents conventionally known to the public may be contained.

The inventors have found that the improvement effects aforementioned is obtained if the aluminum plate having foreign elements setting at aforementioned ranges is used since, in that case, uniform and big pits can be formed by electrolytic graining treatment described later and a preferable surface shape can be formed.

Particularly, the support for lithographic printing plate which is obtained by performing graining treatment including electrolytic graining treatment on the aluminum plate containing the foreign elements in the aforementioned ranges and satisfies the factors representing the surface shape that are found using the aforementioned AFM is excellent in printing performance and handling property at a high level when the lithographic printing plate is prepared.

Next, the method of manufacturing the aluminum plate according to the present invention will be described.

When an aluminum alloy is manufactured as a plate material, the following methods, for example, can be used.

First, purification treatment is performed on a molten aluminum alloy prepared so as to have a predetermined alloy component content according to the conventional method to perform casting. In the purification treatment, unnecessary gases such as hydrogen gas and solid impurities mixed in the molten metal are removed. The purification treatments to remove unnecessary gases include, for example, flux treatment; degassing treatment which uses argon gas, chlorine gas or the like. In addition, the purification treatments to remove solid impurities include, for example, filtering treatment which uses rigid media filters such as ceramic tube filter and ceramic foam filter, filters with filter media such as alumina flake and alumina ball and glass cross filter. Moreover, the purification treatment in combination of degassing treatment and filtering treatment can be performed.

It is preferable that these treatments are performed to prevent defects attributable to foreign matters such as non-metal inclusion and oxides in the molten metal or defects caused by gasses dissolved in the molten metal. As molten metal filtering treatments, for example, the methods described in JP 6-57342 A, JP 3-162530 A, JP 5-140659 A, JP 4-231425 A, JP 4-276031 A, JP 5-311261 A and JP 6-136466 A can be used. In addition, as molten metal degassing treatment, for example, the methods described in JP 5-51659 A, JP 5-51660 A, JP 5-49148 A and JP 7-40017 A can be used.

Subsequently, casting is performed on the aluminum alloy molten metal in either a casting process using a stationary mold represented by DC casting process or a casting process using driven mold represented by a continuous casting process.

In DC casting, the molten metal is solidified at the cooling rate ranging from 1 to 300° C./sec. If the cooling rate is less than 1° C. /sec, a number of coarse intermetallic compounds may be formed. If DC casting is performed, an ingot with plate thickness of 300 to 800 mm can be manufactured.

As a continuous casting process, the Hunter method and the method using a cooling roller represented by 3C method, the Huzley method and the method using a cooling belt or a cooling block represented by Alusuisse-made caster II type are utilized in the casting industry. If the continuous casting method is used, the molten metal is solidified at the cooling rate ranging from 100 to 1,000° C./sec. Since the cooling rate of the continuous casting method is generally faster than that of DC casting method, the former has a characteristic that the degree of solid solution of alloy component to an aluminum matrix can be increased. For the continuous casting method, for example, the methods described in JP 3-79798 A, JP 5-201166 A, JP 5-156414 A, JP 6-262203 A, JP 6-122949 A, JP 6-210406 A and JP 6-262308 A can be used.

Since, in case of DC casting method, an ingot with plate thickness of 300 to 800 mm is manufactured, the surface of the ingot is cut by 1 to 30 mm, preferably 1 to 10 mm by facing according to a conventional method. Thereafter, soaking treatment is performed if required. If soaking treatment is performed, thermal treatment is performed at 450 to 620° C. for l to 48 hours so as not to allow an intermetallic compound to be large-sized. If the time is less than 1 hour, the effect of soaking treatment may be insufficient. If the stabilization of the intermetallic compound is not required, soaking treatment can be omitted.

Thereafter, hot rolling and cold rolling are performed to manufacture the rolled plate of the aluminum alloy plate. It is appropriate that the starting temperature of the hot rolling is 350 to 500° C. Intermediate annealing treatment may be performed before or after the hot rolling or halfway the hot rolling. The conditions are that the plate is heated at 280 to 600° C. for 2 to 20 hours using a batch-type annealing furnace, preferably is heated at 350 to 600° C. for 2 to 10 hours or the plate is heated at 400 to 600° C. for 6 minutes or less using a continuous annealing furnace, preferably is heated at 450 to 550° C. for 2 minutes or less. A crystal structure can be made fine by heating the plate at a rate of temperature rise of 10° C./sec using a continuous annealing furnace. If the crystal structure is fine at a time when hot rolling terminates, an intermediate annealing may be omitted. The cold rolling is described, for example, in JP 6-210308 A.

For the aluminum alloy plate finished with a predetermined thickness of 0.1 to 0.5 mm by the aforementioned processes, the planarity of the same may be improved by sizing devices such as a roller leveler and a tension leveler.

It is preferable that the aluminum plate is of the sectional shape as follows:

The aluminum plate is normally stored for a predetermined period of time with the same wound as coil. In a plate cross section, if an end of the plate, that is, an ear section is too thick, the thick areas are plastic deformed while the plate wound as coiled in several thousand meters is stored, and a distortion at the end called an ear distortion is generated. Similarly, if the internal side of the plate is too thick, plastic deformation is generated to cause a deformation inside the plate called a gut distortion.

Since the gut distortion is unlikely to occur as compared to the ear distortion, it is preferable that in the present invention, top priority is given to the prevention of occurrence of ear distortion, and that the plate thickness of the internal side of the plate is somewhat bigger than that of the end of the plate in finished conditions. Concretely, it is preferable that a-value as defined below is determined to be 1.0 or less in order to allow the plate thickness of the ear section with respect to the average plate thickness of the plate to be a certain thickness or less. In addition, it is preferable that pc value as defined below is determined to be 2.0% or less in order not to allow the plate thickness of the internal side of the plate to be too thick with respect to the average plate thickness. In the aforementioned cold rolling process, the a-value and the pc-value can be controlled to be the desired values by controlling the flexible shape of the cold rolling.

$$a=h/c$$

$$pc=c/tc\times 100(\%)$$

h: Difference between plate thickness of ear section and minimum plate thickness c: Difference between maximum plate thickness at the central section and minimum plate thickness tc: Maximum plate thickness at the central section Note that these values can be more easily understood by referring to FIG. 2 in JP 11-254847 A.

In addition, it is preferable that in the present invention, bending per the length of the aluminum plate 4 m is 0.3 mm or less. If the bending of the aluminum plate is big, a winding shift gradually becomes big as winding is performed. If the aluminum plate is wound as a coil, breaking or distortion at the plate end section attributable to winding shift occurs. The target value of the aforementioned bending can be achieved by controlling the parallelism of the cold rolling roll and the sending accuracy of the aluminum plate by a cold rolling mill.

In addition, it is preferable that in the present invention, the height of burr at the plate end is 10 μm or less. If the burr at the end section is high, plastic deformation is likely to take place at the end section while the aluminum plate wound as a coil is stored due to the same reason as in the description of the sectional shape. In addition, in the surface treatment for obtaining a support for a lithographic printing plate or the image recording layer coating process for preparing a presensitized plate, the burr is not preferable since the burr is likely to scratch presensitized plate preparing equipment such as a path roll and a coating device. Therefore, it is preferable that the height of the burr is determined to be 10 μm or less as mentioned above. The height of the burr can be controlled to be 10 μm or less by controlling the clearance of a blade in a slitter process where the ear section of a coil is cut off.

In addition, in order to machine the plate into a predetermined plate width, the plate is usually allowed to pass through a slitter line. Either a shear plane or a fracture plane or both occur at an end of the plate which is cut by the slitter when the end of the plate is cut off by a slitter blade.

It is preferable that in the present invention, the thickness of the aluminum plate is selected in a range of 0.1 to 0.5 mm, and that for the accuracy, the plate thickness difference over the entire length of the coil is within 20 μm, and more preferable is within 12 μm. In addition, it is preferable that the plate thickness difference in the width direction is within 6 μm, and more preferable is within 3 μm. Moreover, it is preferable that the accuracy of the plate width is within 2.0 mm, and more preferable is within 1.0 mm.

Although the surface roughness of the aluminum plate is likely to be affected by that of the reduction roll, it is preferable that the aluminum plate is finished so as to finally allow arithmetic average roughness $R_a$ to be about 0.1 to 1.0 μm. If $R_a$ is too large, it is not preferable in appearance of the plate since the roughness of the aluminum plate from the beginning, that is, the rough rolling streak transferred by the reduction roll can be observed from above the image recording layer in the presensitized plate. It is not industrially preferable that $R_a$ is determined to be 0.1 μm or less since it is necessary to finish the surface of the reduction roll at excessively low roughness.

In addition, in order to prevent the occurrence of scratches caused by the friction of aluminum plates to each other, a thin oil film may be provided on the surface of the aluminum plates. As an oil film, a volatile one or a non-volatile one is suitably used, if necessary. Since a slipping fault may occur on the manufacturing line if the oil quantity is too much, it is preferable that the oil quantity is 100 mg/$M^2$ or less, more preferable is 50 mg/$m^2$ or less, and still more preferable is 10 mg/$M^2$ or less. In addition, scratches may occur while the coil is transferred if no oil is provided, it is preferable that the oil quantity is 3 mg/$m^2$ or more.

In case of the continuous casting, if, for example, the casting is performed by the method using cooling rolls such as Hunter method (twin-roll method), a cast plate with plate thickness of 1 to 10 mm can be directly and continuously cast and rolled, the method has a merit to omit the hot rolling process. In addition, according to the method using cold belts such as Huzley method (two-belt method), a cast plate with plate thickness of 10 to 15 mm can be cast, and generally, a continuously cast rolled plate with plate thickness of 1 to 10 mm can be obtained by continuously rolling the plate using a hot reduction roll immediately after casting.

The continuously cast rolled plate obtained by these methods can be finished into a predetermined plate thickness of 0.1 to 0.5 mm through the processes such as cold rolling, intermediate annealing, improvement of planarity and slit as described in DC casting. For the conditions of intermediate annealing and cold rolling if the continuous casting method is used, for example, the methods described in JP 6-220593 A, JP 6-210308 A, JP 7-54111 A and JP 8-92709 A.

<Graining Treatment>

The support for a lithographic printing plate according to the present invention can be obtained by performing graining treatment including electrochemical graining treatment on the aluminum plate described above.

Therefore, graining treatment including electrochemical graining treatment is performed on the aluminum plate used in the present invention described above. In the present invention, as described above, since the aluminum plate contains the specified elements of the specified quantities, uniform and very fine pits can be formed on the surface of the support for a lithographic printing plate by performing electrochemical graining treatment, and each factor representing the aforementioned surface shape can be satisfied. As a result, the presensitized plate provided with the image recording layer on the support for a lithographic printing plate is excellent in printing performance (press life, scum resistance, sensitivity, cleaner press life or the like) and handling property (scratch resistance, fatigue fracture strength) when the lithographic printing plate is prepared.

In addition, even if the presensitized plate for a laser printing plate is prepared by using the support for a lithographic printing plate and providing a laser direct-drawn type image recording layer, the presensitized plate is excellent in printing performance and handling property as well.

Furthermore, even if the attached quantity of Si atoms onto the surface of the support is determined to be 0.1 to 30 mg/$m^2$, and the presensitized plate is prepared by providing the image recording layer thereon, the presensitized plate is excellent in printing performance and handling property when the lithographic printing plate is prepared without deteriorating the adhesion between the image recording layer and the support.

Electrochemical graining treatment usually performed by applying DC current or AC current between the aluminum plate and an electrode opposite thereto and by using an acid of nitric acid, hydrochloric acid or the like as an electrolytic solution. In AC electrolysis, a commercial AC sinusoidal wave (sine wave) current, a special alternating current, a rectangular current or the like can be used. It is preferable that the concentration of the electrolytic solution is 1 to 300 g/L. An element required to stabilize electrochemical graining treatment can be suitably added in the form of an ion to an electrolytic solution of nitric acid, hydrochloric acid or the like.

Crater-shaped or honeycomb-shaped pits can be produced on the surface of the aluminum alloy plate at the area rate of 30 to 100% (dispersion density) by electrochemical graining treatment.

In the present invention, by controlling the content of Cu in the aluminum alloy, the average diameter of pits produced by nitric acid electrolysis (electrochemical graining treatment in a nitric acid aqueous solution) can be 1.5 μm or more, water retention property can be improved, thereby scum resistance can be improved.

In addition, in the present invention, since, by controlling the content of Cu in the aluminum alloy, the diameter of a pit produced by hydrochloric acid electrolysis (electrochemical graining treatment in a hydrochloric aqueous solution) can be 0.5 μm or less as a circle equivalent diameter and can be preferably 0.3 μm or less, and formed pits of 10% or more can be an approximate square or a rectangle to thereby increase the surface area of the aluminum plate, the adhesion with the image recording layer can be improved.

It is preferable that for the quantity of electricity used for electrochemical graining treatment in case of nitric acid electrolysis, the total quantity of electricity in anodic reaction is 50 to 400 C/$dm^2$, and more preferable is 100 to 300 C/$dm^2$. It is preferable that the total quantity of electricity in anodic reaction is 10 to 100 C/$dm^2$, and more preferable is 30 to 80 C/$dm^2$. It is preferable that hydrochloric acid electrolysis is performed after nitric acid electrolysis.

It is preferable that in the present invention, electrochemical graining treatment is combined with other graining treatments. Other graining treatments include, for example, mechanical graining treatment, chemical graining treatment or the like. Here, the method using an abrasive and a brush roll, or the method of transferring the asperities to the surface of the aluminum plate is preferable as a mechanical graining treatment.

It is preferable that as graining treatments, graining treatment is performed in the order of mechanical graining treatment, nitric acid electrolytic graining and hydrochloric acid graining.

Note that it is preferable that after each graining treatment, the chemical etching treatment mainly consisting of an alkali solution is performed to remove sharp areas, desmutting treatment mainly consisting of an acid solution is performed to remove products produced by the chemical etching treatment.

These graining treatments can be each performed with the methods generally used.

Particularly, it is preferable that chemical etching treatment is performed in a solution mainly containing the aforementioned alkali after the aforementioned nitric acid electrolytic graining treatment so as to allow the meltage of the aluminum plate to be 1 g/$m^2$ or more, more preferable is so as to allow the meltage to be 2 g/$m^2$ or more and further preferable is so as to allow the meltage to be 3 g/$m^2$ or more and less than 4 g/$m^2$ from a viewpoint that scratch resistance can be enhanced.

By performing the aforementioned graining treatment on the aluminum plate consisting of the specified composition obtained from the aforementioned manufacturing method, the support for a lithographic printing plate having the factors (each surface area ratio and each steepness) representing the surface shape found with an atomic force microscope can be obtained, the support for a lithographic printing plate can simultaneously achieve both printing performance (press life, scum resistance, sensitivity and cleaner press life) and handling property (scratch resistance and fatigue fracture strength) when the lithographic printing plate is prepared from the presensitized plate by providing the image recording layer on the support for a lithographic printing plate.

The measurement methods of pit shapes formed by nitric acid electrolysis, hydrochloric acid electrolysis or the like are as follows:

The surface of the support is photographed right overhead at 50,000-fold magnification with a high resolution scanning electron microscope (FESEM) and the total number of pits whose average a circle equivalent diameter of 0.5 μm or less is counted in the obtained SEM micrograph.

Next, in the SEM micrograph, a non-round pit whose radius of curvature (R) at an angular section is one-fourth the size of the a circle equivalent diameter of the pit or less is determined to be an approximate square or a rectangle, and the number of the pits are counted. The number of the pits with an approximate square or rectangle is divided by the total number of the pits with an average a circle equivalent diameter of 0.5 μm or less to calculate the rate of the pits with an approximate square or rectangle.

<Anodizing Treatment>

It is preferable that anodizing treatment is performed to increase abrasion resistance of the surface of the aluminum plate following graining treatment.

An electrolyte used for anodizing treatment may be any electrolyte which could form porous anodizing layers. Sulfuric acid, phosphoric acid, oxalic acid, chromic acid or these mixtures are generally used. The concentration of the electrolyte is suitably determined depending upon the kind of the electrolyte or the like. Although the conditions of anodizing treatment are hardly specified since they largely vary with electrolytes, the conditions may be generally that the concentration of the electrolyte is 1 to 80 wt %, the temperature of the electrolyte is 5 to 70° C., the current density is 1 to 60 A/$dm^2$, the voltage is 1 to 100 V and the electrolysis time is 10 to 300 sec.

<Treatment for Water Wettability>

As mentioned above, for the aluminum plate on which graining treatment is performed, preferably anodizing treatment is further performed, treatment for water wettability is still further performed by using an aqueous solution containing an alkali metal silicate.

Although various methods conventionally known can be used as a treatment for water wettability with an alkali metal silicate, it is preferable that the adhesion quantity of the alkali metal silicate to the surface of the support is set in a predetermined range.

It is preferable that in the present invention, the Si atom converted adhesion quantity of the alkali metal silicate to the surface of the support for a lithographic printing plate (Si atom adhesion quantity) is 0.1 mg/$m^2$ or more, and more preferable is 2.0 mg/$M^2$ or more. If the Si atom adhesion quantity is less than 0.1 mg/$m^2$, one or more of sensitivity, cleaner press life and scum resistance or more may deteriorate. In addition, since water wettability is increased in the non-image areas of a lithographic printing plate, if development is performed by using a developer containing an alkali metal silicate, a solid substance attributable to $SiO_2$ may be deposited, the non-image areas may be whitened at the time of development or scum or slime may be produced at the time of development.

On the other hand, it is preferable that in the present invention, Si atom adhesion quantity is 30 mg/$m^2$ or less, and further preferable is 20 mg/$M^2$ or less, and still more preferable is 10 mg/$m^2$ or less. If Si atom adhesion quantity exceeds 30 mg/$m^2$, press life may be inferior.

In the present invention, the adhesion quantity of an alkali metal silicate to the surface of the support for a lithographic printing plate uses a value measured as Si atom adhesion quantity (Si mg/$m^2$) with a calibration curve method using X-ray Flourescence Spectrometer (XRF). As a standard specimen for preparation of the calibration curve, after a sodium silicate aqueous solution containing the already known Si atom quantity is uniformly dropped in an area of 30 mmΦ on an aluminum plate, the specimen which is dried is used. Models of the X-ray Flourescence Spectrometer and other conditions are not particularly limited. One example of the conditions of X-ray Flourescence Spectrometry of Si is described below.

X-ray Flourescence Spectrometer: RIGAKU Corporation-made RIX3000, X-ray lamp: Rh, Measurement spectrum: Si—Kα, Lamp voltage: 50 kV, Lamp current: 50 mA, Slit: COARSE, Analyzing crystal: RX4, Detector: F—PC, Analyzed area: 30 mmΦ, Peak position (2θ):144.75 deg., Background (2θ): 140.70 deg. and 146.85 deg., Elapsed time: 80 sec./sample Treatment for water wettability can be performed, for example, by dipping the support for a lithographic printing plate on which anodizing treatment has been performed into the aqueous solution containing an alkali metal silicate where the concentration of an alikali metal silicate is 0.001 to 30 wt %, preferably 0.01 to 10 wt %, more preferably 0.1 to 5 wt % and pH is 10 to 13 at 25° C. at 4 to 40° C. for 0.5 to 120 sec., and preferably 2 to 30 sec. The treatment conditions such as the aforementioned concentration of the alkali metal silicate, pH, temperature of the aqueous solution and treatment time can be properly selected so as to allow Si atom adhesion quantity to be the aforementioned specified quantities. If pH of the aqueous solution containing an alkali metal silicate is less than 10, the solution is likely to be gelled. In addition, it is necessary to use care that pH higher than 13.0 may cause the anodizing layers to be dissolved.

The alkali metal silicates used for treatment for water wettability include, for example, sodium silicate, potassium silicate and lithium silicate.

In the treatment for water wettability, a hydroxide can be blended to control pH of the aqueous solution containing an alkali metal silicate at a high level if required. The hydroxides include, for example, sodium hydroxide, potassium hydroxide and lithium hydroxide.

In addition, an alkaline earth metal salt and/or 4 group (IVA group) metal salt may be blended in the aqueous solution containing an alkali metal silicate aqueous solution if required. Alkaline earth metal salts include, for example, water-soluble salts of nitrates of alkaline earth metals (for example, calcium nitrate, strontium nitrate, magnesium nitrate, barium nitrate), sulfate, hydrochloride, phosphate, acetate, oxalate, borate or the like. The 4 group (IVA group) metal salts include, for example, titanium tetrachloride, titanium trichloride, potassium titanium fluoride, potassium titanium oxalate, titanium sulfate, titanium tetraiodide, zirconium chloride oxide, zirconium dioxide, zirconium oxychloride and zirconium tetrachloride. Alkaline earth metal salts and 4 group (IVA group) metal salt may be each used singly or two kinds or more of combinations may be used. The usage of these metal salts are preferably 0.01 to 10 wt %, and more preferably 0.05 to 5.0 wt %.

[Presensitized Plate]

<Undercoat Layer>

In the present invention, for example, inorganic undercoats such as water-soluble metal salts, e.g. zinc borate, or organic undercoats may be provided as required before a photosensitive layer is provided on an aluminum support for a lithographic printing plate according to the present invention thus obtained.

Taken up as organic compounds used for an organic undercoat for example are carboxymethylcellulose; dextrin; gum arabic; polymer or copolymer having sulfo group at side chain; polyacrylic acid; phosphonic acids having amino groups such as 2-aminoethyl phosphonic acid; organic phosphonic acids such as phenylphosphonic acid, naphthylphosphonic acid, alkylphosphonic acid, glycerophosphonic acid, methyldisuphosphonic acid and ethylenediphosphonic acid which may have a substituent; organic phosphoric acids such as; phenylphosphoric acid, naphthylphosphoric acid, alkylphosphoric acid and glycerophosphoric acid which may have a substituent; organic phosphinic acids such as phenylphosphinic acid, naphthylphosphinic acid, alkylphosphinic acid and glycerophosphinic acid which may have a substituent; amino acids such as glycine and β-alanine; amine hydrochlorides having hydroxy groups such as triethanolamine hydrochlorides; yellow dyes. For these compounds, either they may be singly used or a combination of two kinds or more may be used.

An organic undercoat is provided by dissolving the above organic compound in water or organic solvents such as methanol, ethanol, methylethylketone or their mixed solvent, applying the solvent to an aluminum plate and drying the solvent. It is preferred that the concentration of a solution dissolving the organic compound is 0.005 to 10 wt %. A coating method is not particularly limited and any of bar coater coating, rotary coating, spray coating, curtain coating and the like can be used.

It is preferred that the coated quantity after an organic undercoat is dried is 2 to 200 $mg/m^2$ and more preferred is 5 to 100 $mg/m^2$. If the coated quantity remains within the above range, press life becomes better.

[Image Recording Layer]

A support for a lithographic printing plate according to the present invention can be provided with an image recording layer to prepare a presensitized plate according to the present invention. A photosensitive composition is used for the image recording layer.

Taken up as photosensitive compositions suitably used for the present invention for example are a photosensitive composition of the thermal positive type containing an alkali-soluble high-molecular compound and a photothermal conversion agent (hereinafter referred to as "thermal positive type" with regard to this composition and an image recording layer using the same), a photosensitive composition of the thermal negative type containing a curable compound and a photothermal conversion agent (hereinafter similarly referred to as "thermal negative type"), a photosensitive composition of the photopolymerization type (hereinafter similarly referred to as "photopolymer type"), a photosensitive composition of the negative type containing diazo resin or photo cross-linkable resin (hereinafter similarly referred to as "conventional negative type"), a photosensitive composition of the positive type containing a quinonediazide compound (hereinfater similarly referred to as "conventional positive type") and a photosensitive composition dispensing with an independent development (hereinafter similarly referred to as "development-dispensable type"). Below described are these suitable photosensitive compositions.

<Thermal Positive Type>

<Photosensitive Layer>

A photosensitive composition of the thermal positive type contains a water-insoluble and alkali-soluble high-molecular compound (referred to as "alkali-soluble high-molecular compound" in the present invention) and a photothermal conversion agent. In a image recording layer of the thermal positive, the photothermal conversion agent converts the exposure energy of infrared ray laser and the like into heat, which efficiently cancels an interaction lowering the alkali-solubility of an alkali-soluble high-molecular compound.

Taken up as alkali-soluble high-molecular compound for example are a resin containing an acid group in a molecule and a mixture of two kinds or more of the resin. Particularly preferred is a resin having acid groups such as a phenolic hydroxy group, sulfonamide group ($—SO_2$ NH—R (where, R represents a hydrocarbon group)), and active imino group ($—SO_2$ NHCOR, $—SO_2$ $NHSO_2$ R or $—CONHSO_2R$ (where, R has the similar meaning to the above.)) from the view point of the solubility of the resin to an alkali developer.

Above all, the resin having the phenolic hydroxy group is preferable since it is excellent in image-forming capability in the exposure by an infrared ray laser or the like. For example, novolac resins such as phenol-formaldehyde resin, m-cresol-formaldehyde resin, p-cresol-formaldehyde resin, m-/p-mixed cresol-formaldehyde resin and phenol/cresol (any of m-, p- and m-/p- mixed may be allowed) -mixed-formaldehyde resin (phenolcresolformaldehyde cocondensation resin), are preferably cited. More specifically, polymers described in JP 2001-305722 A (particularly, [0023] to [0042]), polymers containing a repeating unit expressed by a general formula (1) as described in JP 2001-215693 A and polymers as described in JP 2002-311570 A (particularly, [0107]) are preferably used.

As the photothermal conversion agent, from a viewpoint of a recording sensitivity, pigment or dye, which has a light absorbing band in the infrared band ranging from 700 to 1200 nm in wavelength, is preferable. Concretely cited as the dye are azo dye, azo dye in the form of metallic complex salt, pyrazolone azo dye, naphthoquinone dye, anthraquinone dye, phthalocyanine dye, carbonium dye, quinonimine dye, methine dye, cyanine dye, squarylium dyestuff, pyrylium salt, metal thiolate complex (for example, nickel thiolate complex) and the like. Particularly, the cyanine dye is preferable and, for example, the cyanine dye represented by the general formula (I) in JP 2001-305722 A is cited.

A dissolution inhibitor can be contained in the photosensitive composition of the thermal positive type. Suitably taken up as a dissolution inhibitor is one as described in [0053] to [0055] of JP 2001-305722 A.

In addition, it is preferred that a sensitivity regulator, a printing agent to obtain an visible image just after heated by exposure, compounds such as dyes as colorant and a surfactant to improve coating property and treatment stability are contained in the photosensitive composition of the thermal positive type as additives. Compounds as described in [0056] to [0060] of JP 2001-305722 A are preferred for these compounds.

Besides the foregoing aspects, suitably used are photosensitive compositions as described in 2001-305722 A.

In addition, the image recording layer of the thermal positive type may be either a single layer or a two-layer structure.

Suitably taken up as the image recording layer of a two-layer structure (image recording layer of superimposed-type) is a type where a lower layer (hereinafter referred to as "A layer") excellent in press life and solvent resistance is provided on the side closer to the support and a layer (hereinafter referred to as "B layer") excellent in an image-forming capability of positive type is provided on the A layer. This type is of high sensitivity and can realize a broader development latitude. The B layer generally contains a photothermal conversion agent. The above-mentioned dyes are suitably taken up as photothermal conversion agents.

Suitably taken up as resins used for the A layer is a polymer which includes a monomer having sulfonamide group, active imino group, phenolic hydroxy group and the like as a copolymerization component since the polymer is excellent in press life and solvent resistance. Suitably taken up as resins used for the B layer is a resin soluble in an alkali aqueous solution having a phenolic hydroxy group.

Various additives can be contained in compositions used for the A and B layers as required besides the aforementioned resins. Concretely, suitably used are various additives as described in [0062] to [0085] of JP 2002-323769 A. In addition, also suitably used are additives as described in [0053] to [0060] of JP 2001-305722 A as aforementioned.

It is preferred that for each component and its content included in the A layer or the B layer, what is described in JP 11-218914 A is followed.

<Intermediate Layer>

It is preferred that an intermediate layer is provided between the image recording layer of the thermal positive type and the support. Suitably taken up as components contained in the intermediate layer are various organic compounds as described in [0068] of JP 2001-305722 A.

<Others>

A method for preparing the image recording layer of the thermal positive type and a method for making a plate can use a method as detailedly described in JP 2001-305722 A.

<Thermal Negative Type>

A photosensitive composition of the thermal negative type contains a curable compound and a photothermal conversion agent. An image recording layer of the thermal negative type is a photosensitive layer of the negative type where areas irradiated by an infrared ray laser or the like are cured to form image areas.

<Polymerizable Layer>

An image recording layer of the polymerizable-type (polymerizable layer) is suitably taken up as the image recording layer of the thermal negative type. The polymerizable layer contains a photothermal conversion agent, a radical generator, a radical polymerizable compound which is a curing compound and a binder polymer. In the polymerizable layer, the infrared rays absorbed by a photothermal conversion agent are converted into heat, which decomposes a radical generator to generate radicals, which allows a radical polymerizable compound to continuously polymerize and a radical polymerizable compound cure.

Taken up as a photothermal conversion agent for example is a photothermal conversion agent contained in the aforementioned the thermal positive type. Taken up as a concrete example of cyanine dye stuff which is particularly preferred are those as described in [0017] to [0019] of JP 2001-133969 A.

Onium salts are suitably taken up as radical generators. Particularly preferred are onium salts as described in [0030] to [0033] of JP 2001-133969 A.

Taken up as a radical polymerizable compound is a compound having at least one, and preferably two or more of the ethylenically unsaturated end bondings.

A linear organic polymer is suitably taken up as a binder polymer. Suitably taken up is a polymer which is soluble or swellable in water or alkalescent aqueous water. Among them, a (meth)acryl resin having unsaturated groups such as allyl group and acryloyl group or benzyl group, and carboxy group at side chain is suitable since the resin is excellent in a balance of layer strength, sensitivity and development property.

For a radical polymerizable compound and a binder polymer, those as detailedly described in [0036] to [0060] of JP 2001-133969 A can be used.

It is preferred that additives (for example, a surfactant to improve coating property) as described in [0061] to [0068] of JP 2001-133969 A are contained in a photosensitive composition of the thermal negative type.

For a method for preparing the polymerization layer and a method for making a plate, the methods as detailedly described in JP 2001-133969 A can be used.

<Acid Cross-Linkable Layer>

An image recording layer of acid cross-linkable type (acid cross-linkable layer) is suitable taken up also as one of the image recording layers of the thermal negative type. The acid cross-linkable layer contains a photothermal conversion agent, an acid generator by heat, a compound which is cross-linked by an acid that is a curable compound (cross-linking agent) and an alkali-soluble high-molecular compound which may react with a cross-linking agent under the presence of an acid. In the acid cross-linkable layer, infrared rays absorbed by the photothermal conversion agent are converted into heat, which decomposes the acid generator by heat to generate an acid, which allows the cross-linking agent to react with the alkali-soluble high-molecular compound and cure.

The same photothermal conversion agents as used in the polymerizable layer are taken up at this stage.

Taken up as acid generator by heat for example are decomposable compounds by heat such as a photoinitiator for the photopolymerization, a color-turning agent (i.e., dye stuff) and an acid generator for use in micro resist.

Taken up as cross-linking agents for example are aromatic compounds substituted with a hydroxymethyl group or an alkoxymethyl group; compounds having a N-hydroxymethyl group, a N-alkoxymethyl group or a N-acyloxymethyl group; and expoxy compound.

Taken up as an alkali-soluble high-molecular compound for example are novolak resin and polymer having hydroxyaryl group at side chain.

<Photopolymer Type>

A photopolymerization type photosensitive composition contains an addition polymerizable compound, a photopolymerization initiator and a high-molecular binding agent.

Suitably taken up as the addition polymerizable compound is a compound containing ethylenically unsaturated bonding capable of addition polymerization. The compound containing ethylenically unsaturated bonding is a compound having an ethylenically unsaturated end bonding. Concretely, it has a chemical form of monomer, prepolymer, mixtures of these or the like for example. Taken up as examples of the monomer are an ester of an unsaturated carboxylic acid (for example, acrylic acid, methacrylic acid, itaconic acid and maleic acid) and an aliphatic polyalcohol compound and the amide of an unsaturated carboxylic acid and an aliphatic polyamine compound.

In addition, a urethane type addition polymerizable compound is suitably taken up also as an addition polymerizable compound.

As the photopolymerization initiator, a variety of photopolymerization initiators or combined systems of two or more photopolymerization initiators (photo initiation systems) can be appropriately selected for use. For example, initiation systems described in [0021] to [0023] of JP 2001-22079 A are preferable.

Since the high-molecular binding agent needs not only to function as a coating layer forming agent for the photopolymerization type photosensitive composition but also to dissolve the photosensitive layer in an alkali developer, an organic high-molecular polymer that is soluble or swellable in an aqueous solution of alkali is used. As the above-described high-molecular binding agent, the agents described in [0036] to [0063] of JP 2001-22079 A are preferred.

It is preferable to add the additive described in [0079] to [0088] of JP 2001-22079 A (for example, a surfactant for improving the coating property, a colorant, a plasticizer, and a thermal polymerization inhibitor) to the photopolymerization type photosensitive composition of the photopolymer type.

Moreover, it is also preferable to provide an oxygen-shieldable protective layer on the above-described image recording layer of the photopolymer type for preventing the polymerization inhibiting action of oxygen. For example, poly(vinyl alcohol) and a copolymer thereof are cited as a polymer contained in the oxygen-shieldable protective layer.

Furthermore, it is also preferable that an intermediate layer or adhesive layer as described in [0124] to [0165] of JP 2001-228608 A is provided.

<Conventional Negative Type>

A photosensitive composition of the conventional negative type contains diazo resin or photo closs-linkable resin. Among them, a photosensitive composition containing diazo resin and a high-molecular compound that is soluble or swellable in alkali (binding agent) is suitably cited.

Cited as such diazo resin is, for example, a condensate of an aromatic diazonium salt and a compound containing an active carbonyl group such as formaldehyde, and an inorganic salt of diazo resin soluble in organic solvents, which is a reaction product of a condensate of p-diazo phenyl amines and formaldehyde with hexafluorophosphate or tetrafluoroborate. Particularly, a high-molecular diazo compound containing 20 mol % or more of a hexamer or larger, which is described in JP 59-78340 A, is preferable.

For example, copolymer containing, as an essential component, acrylic acid, methacrylic acid, crotonic acid or maleic acid is cited as a binding agent. Specifically, multi-copolymer of monomer such as 2-hydroxyethyl(meth)acrylate, (meth)acrylonitrile and (meth)acrylic acid, which is as described in JP 50-118802 A, and multi-copolymer composed of alkylacrylate, (metha)acrylonitrile and unsaturated carboxylic acid, which is as described in JP 56-4144 A, are cited.

Furthermore, to the photosensitive composition of the conventional negative type, it is preferable to add a compound such as a printing agent, a dye, a plasticizer for imparting the flexibility and abrasion resistance of the coating layer, a compound such as a development accelerator, and a surfactant for improving the coating property, which are described in [0014] and [0015] of JP 7-281425 A.

It is preferable that an intermediate layer containing a high-molecular compound having a constituent with an acid group and a constituent with an onium group, which is described in JP 2000-105462 A, is provided under the photosensitive layer of the conventional negative type.

<Conventional Positive Type>

As a photosensitive composition of the conventional positive type contains quinonediazide compound. Among them, the photosensitive composition containing an o-quinonediazide compound and alkali-soluble high-molecular compound is suitably cited.

Cited as such an o-quinonediazide compound are, for example, an ester of 1,2-naphthoquinone-2-diazide-5-sulfonyl chloride and phenol-formaldehyde resin or cresol-formaldehyde resin, and an ester of 1,2-naphthoquinone-2-diazide-5-sulfonyl chloride and pyrogallol-acetone resin, which is described in U.S. Pat. No. 3,635,709.

Cited as such an alkali-soluble high-molecular compound are, for example, phenol-formaldehyde resin, cresol-formaldehyde resin, phenol-cresol-formaldehyde co-condensed resin, polyhydroxystyrene, copolymer of N-(4-hydroxyphenyl)methacrylamide, carboxy group-containing polymer described in JP 7-36184 A, acrylic resin containing a phenolic hydroxy group as described in JP 51-34711 A, acrylic resin containing a sulfonamide group described in JP 2-866 A, and urethane resin.

Furthermore, it is preferable that a compound such as a sensitivity regulator, a printing agent and a dye, which are described in [0024] to [0027] of JP 7-92660 A, or a surfactant for improving a coating property, which is as described in [0031] of JP 7-92660 A, is added to the photosensitive composition of the conventional positive type.

It is preferred that an intermediate layer which is the same layer suitably used for the conventional negative type is provided under photosensitive layer of the conventional positive type.

<Development-Dispensable Type>

Taken up as a photosensitive compositions of the development-dispensable type are a thermoplastic particle polymer type, a microcapsule type, a type containing sulfonic acid-generating polymer and the like. These are all thermosensitive types containing photothermal conversion agents. It is preferred that a photothermal conversion agent is the same dye as used for the aforementioned thermal positive type.

A photosensitive composition of the thermoplastic particle polymer type is a composition in which hydrophobic thermowelding resin particle polymers are dispersed in a hydrophilic polymer matrix. In an image recording layer of the thermoplastic particle polymer type, a hydrophobic thermoplastic particle polymers are welded by a heat generated by exposure and these are welded and adhered to each other to form a hydrophobic area, namely, an image area.

It is preferred that the particles are welded and mutually fuse by heat and more preferred the particle polymers are one that the surface of the particle polymers is hydrophilic and the particle polymers can be dispersed in hydrophilic components such as fountain solution. Concretely, suitably taken up are thermoplastic particle polymers as described in Research Disclosure No.33303 (Published in January, 1992), JP 9-123387 A, JP 9-131850 A, JP 9-171249 A, JP 9-171250 A and EP 931,647 A. Preferred are polystyrene and poly methyl methacrylate among them. Taken up as particle polymers having a hydrophilic surface for example are ones that polymers per se are hydrophilic; and polymers with the surface made hydrophilic by allowing hydrophilic compounds such as poly (vinyl alcohol) and polyethylene glycol to be adsorbed to the surface of a particle polymer.

Preferred is a particle polymer having a reactive functional group.

As a photosensitive composition of the microcapsule type, one described in JP 2000-118160 A and a microcapsule type containing a compound having a thermoreactive functional group as described in JP 2001-277740 A are preferably cited.

As a sulfonic acid-generating polymer for use in a photosensitive composition of the type containing the sulfonic acid-generating polymer, for example, polymer having a sulfonic acid ester group, a disulfonic group or a sec- or tert-sulfonamide group in the side chain described in JP 10-282672 A is cited.

The hydrophilic resin can be contained in the thermosensitive layer of the development-dispensable type, and thus, not only the on-machine development property would be improved, but also the coating layer strength of the thermosensitive layer itself would be improved. Preferred as hydrophilic resins are, for example, resins having hydrophilic groups such as hydroxy group, carboxy group, hydroxyethyl group, hydroxypropyl group, amino group, aminoethyl group, aminopropyl group and carboxymethyl group and hydrophilic sol-gel conversion type binding resins.

The image recording layer of the development-dispensable type dispenses with an independent development process and development processing can be performed on a printing press. For a method for preparing the image recording layer of the development-dispensable type and a method for making plate and printing, the methods as detailedly described in JP 2002-178655 A can be used.

<Backcoat Layer>

A backcoat layer can be provided on the back side of the presensitized plate according to the present invention thus obtained by providing various image recording layers on the support for a lithographic printing plate according to the present invention if required in order to prevent possible scratches on image recording layers, for example, when superimposed, or the like.

<Method of Producing a Presensitized Plate>

Usually, the respective layers of the image recording layer and the like can be produced by coating a coating liquid obtained by dissolving the foregoing components into a solvent on the support for the lithographic printing plate.

Cited as solvents used herein are ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolan, γ-butyrolactone, toluene, water and the like. However, the present invention is not limited to this. These solvents are used singly or mixedly.

It is preferable that the concentration of the foregoing components (entire solid part) in the solvent range from 1 to 50 wt %.

Various coating methods can be used. For example, bar coater coating, rotation coating, spray coating, curtain coating, dip coating, air knife coating, blade coating, roll coating and the like can be cited.

<Method of Plate Making (Method of Producing a Lithographic Printing Plate)>

The presensitized plate of the present invention used the support for a lithographic printing plate according to the present invention is made into a lithographic printing plate by various treatment methods in accordance with the kind of the image recording layer.

Cited as light sources of active rays for use in the image exposure are, for example, a mercury lamp, a metal halide lamp, a xenon lamp and a chemical lamp. As laser beams, for example, helium-neon (He—Ne) laser, argon laser, krypton laser, helium-cadmium laser, KrF excimer laser, semiconductor laser, YAG laser and YAG-SHG laser are cited.

If after the exposure is performed, an image recording layer is either of the thermal positive type, the thermal negative type, the conventional negative type, the conventional positive type or the photopolymer type, it is preferred that a lithographic printing plate is obtained by performing development treatment using a developer after exposure is performed.

It is preferred that a developer is an alkali developer and more preferred is an alkaline aqueous water substantially containing no organic solvent.

In addition, also preferred is a developer substantially containing no alkali metal silicates and containing saccharaides (a developer substantially containing no an alkali metal silicate). For a method for performing development treatment using a developer substantially containing no an alkali metal silicate, the method as detailedly described in JP 11-109637 A can be used.

In addition, a developer containing an alkali metal silicate can be also used.

If the method of treating the presensitized plate that development treatment is performed with a developer substantially containing no alkali metal silicate is used, the method can prevent such problems as that when development treatment is performed with a developer containing an alkali metal silicate, that is, what a solid matter attributable to $SiO_2$ is likely to deposit and what a gel attributable to $SiO_2$ is produced in the neutralization process when a waste developer is treated.

The presensitized plate according to the present invention provided with the image recording layer on the support for a lithographic printing plate according to the present invention which satisfies the factors representing the aforementioned surface shape obtained by performing graining treatment including electrochemical graining treatment on the aluminum plate according to the present invention described above is excellent in printing performance and handling property when the lithographic printing plate is prepared.

Particularly, the presensitized plate according to the present invention provided with the image recording layer on the support for a lithographic printing plate where the number of the local deep areas stays within the range of the present invention is more excellent in sensitivity.

In addition, the presensitized plate according to the present invention provided with a laser exposed type image recording layer on the support for a lithographic printing plate using the aluminum plate according to the present invention is excellent in printing performance and handling property when the lithographic printing plate is prepared and further, can be treated with the developer containing no alkali metal silicate.

EXAMPLES

Although the present invention is described in detail by illustrating Examples below, the present invention is not limited to them.

Examples 1 to 26 and Comparative Examples 1 to 11

1. Preparation of Support for Lithographic Printing Plate
<Aluminum Plate>

A molten metal was prepared by using an aluminum alloy containing metal elements shown in Table 1 and the remaining portion consisting of aluminum and unavoidable impurities, after molten metal treatment and filtration were performed, an ingot with thickness of 500 mm and width of 1,200 mm was prepared with DC casting method. After the surface of the ingot was cut off by averaged thickness of 10 mm, the ingot was kept at 550° C. for about 5 hours, when the temperature dropped to 400° C., a rolled plate with thickness of 2.7 mm was prepared by a hot rolling mill. Furthermore, after thermal treatment was performed on the rolled plate at 500° C. by a continuous annealer, the plate with thickness of 2.4 mm was finished by cold rolling, the width of the aluminum plate was adjusted to 1,030 mm to obtain the aluminum plates of Al-1 to Al-32.

| Aluminum plate | Content of metal element (wt %) | | | |
|---|---|---|---|---|
| | Fe | Si | Cu | Ti |
| Al-1 | 0.27 | 0.08 | 0.025 | 0.010 |
| Al-2 | 0.29 | 0.08 | 0.025 | 0.010 |
| Al-3 | 0.23 | 0.08 | 0.025 | 0.010 |
| Al-4 | 0.20 | 0.08 | 0.025 | 0.010 |
| Al-5 | 0.27 | 0.15 | 0.025 | 0.010 |
| Al-6 | 0.27 | 0.13 | 0.025 | 0.010 |
| Al-7 | 0.27 | 0.10 | 0.025 | 0.010 |
| Al-8 | 0.27 | 0.06 | 0.025 | 0.010 |
| Al-9 | 0.27 | 0.05 | 0.025 | 0.010 |
| Al-10 | 0.27 | 0.04 | 0.025 | 0.010 |
| Al-11 | 0.27 | 0.08 | 0.040 | 0.010 |
| Al-12 | 0.27 | 0.08 | 0.035 | 0.010 |

-continued

| Aluminum plate | Content of metal element (wt %) | | | |
|---|---|---|---|---|
| | Fe | Si | Cu | Ti |
| Al-13 | 0.27 | 0.08 | 0.032 | 0.010 |
| Al-14 | 0.27 | 0.08 | 0.030 | 0.010 |
| Al-15 | 0.27 | 0.08 | 0.024 | 0.010 |
| Al-16 | 0.27 | 0.08 | 0.022 | 0.010 |
| Al-17 | 0.27 | 0.08 | 0.020 | 0.010 |
| Al-18 | 0.27 | 0.08 | 0.025 | 0.020 |
| Al-19 | 0.27 | 0.08 | 0.025 | 0.030 |
| Al-20 | 0.27 | 0.08 | 0.025 | 0.040 |
| Al-21 | 0.27 | 0.08 | 0.025 | 0.050 |
| Al-22 | 0.27 | 0.08 | 0.025 | 0.005 |
| Al-23 | 0.27 | 0.08 | 0.025 | 0.001 |
| Al-24 | 0.18 | 0.08 | 0.025 | 0.010 |
| Al-25 | 0.30 | 0.08 | 0.025 | 0.010 |
| Al-26 | 0.27 | 0.02 | 0.025 | 0.010 |
| Al-27 | 0.27 | 0.16 | 0.025 | 0.010 |
| Al-28 | 0.27 | 0.08 | 0.019 | 0.010 |
| Al-29 | 0.27 | 0.08 | 0.042 | 0.010 |
| Al-30 | 0.27 | 0.08 | 0.010 | 0.010 |
| Al-31 | 0.27 | 0.08 | 0.025 | 0.000 |
| Al-32 | 0.27 | 0.08 | 0.025 | 0.055 |

Various surface treatments of the following (a) to (k) were continuously performed on the obtained aluminum plates Al-1 to Al-32 and each support for a lithographic printing plate of Examples 1 to 26 and Comparative Examples 1 to 11 was obtained.

Shown in Table 2 are the aluminum plates used for each Example and Comparative Example and the combinations of each condition in case of the surface treatment having a plurality of conditions.

Note that water washing was performed after each treatment, and then, a liquid separation was performed with a nip roller.

(a) Mechanical Graining Treatment (Brush Graining Method)

Condition (a-1): Using the device as shown in FIG. 1, mechanical graining treatment was performed by rotating brushes (three bundle-implanted brushes and one channel brush) while supplying the suspension (specific gravity: 1.1 g/cm$^3$) of pumice (median diameter: 33 μm) as a polishing slurry liquid onto the surface of the aluminum plate. FIG. 1 is a side view showing the process concept of a brush graining treatment used for mechanical graining treatment in the preparation of the support for a lithographic printing plate according to the present invention, and 1 represents an aluminum plate, 2 and 4 represent roller-shaped brush, 3 represents a polishing slurry liquid and 5, 6, 7 and 8 represent support rollers in FIG. 1.

In the mechanical graining treatment, for brushes, the bundle-implanted brush, the channel brush, the bundle-implanted brush and the bundle-implanted brush were sequentially used from the upstream side (the right side in FIG. 1) to the carrier direction of the aluminum plate (arrow in FIG. 1). For these rotation directions and rotation speed, normal rotation (the same direction as the carrier direction): 250 rpm, reverse rotation (the reverse direction to the carrier direction): 200 rpm, reverse rotation: 200 rpm and normal rotation: 200 rpm were determined in the order from the upstream side to the carrier direction of the aluminum plate.

The material of the brush was 6°10 nylon, the diameter of the brush bristle was 0.3 mm and the length of the bristle was 50 mm. The brushes were implanted so as to be thick by boring a 300 mm dia. stainless steel-made cylinder by boring thereon so as to be thick. The distance between two support rollers (dia. 200 mm) under the brush was 300 mm. The brush was pressed until the load of the drive motor which rotated the brush was plus 7 kW compared with the load before the brush was pressed against the aluminum plate.

Condition (a-2): For brush, two bundle-implanted brushes and one channel brush were prepared, the bundle-implanted brush, the channel brush and the bundle-implanted brush were sequentially used from the upstream side to the carrier direction of the aluminum plate. For these rotation directions and rotation speed, normal rotation 250 rpm, reverse rotation: 200 rpm and reverse rotation: 250 rpm were determined in the order from the upstream side to the carrier direction of the aluminum plate.

Mechanical graining treatment was performed under the conditions which are the same as the aforementioned conditions(a-1) other than the foregoing conditions.

Condition (a-3): The suspension (specific gravity: 1.1 g/cm$^3$) of pumice (median diameter: 45 μm) was used as a polishing slurry liquid and three channel brushes were used as brushes. For these rotation directions and rotation speed, normal rotation: 250 rpm, reserve rotation: 200 rpm and normal rotation: 250 rpm were determined in the order from the upstream side to the carrier direction of the aluminum plate.

Mechanical graining treatment was performed under the conditions which are the same as the aforementioned conditions (a-1) other than the foregoing conditions.

(b) Alkali Etching Treatment

Alkali etching treatment was performed by spraying an alkali solution (70° C.) containing NaOH of 26 wt % and aluminum ion of 5 wt % to the aluminum plate after mechanical graining treatment from a spray tube so as to allow the aluminum meltage to be 9 g/m$^2$ on the grained surface.

(c) Desmutting Treatment

Desmutting treatment was performed by using an acid aqueous solution with nitric acid concentration of 1 wt % at a temperature of 30° C. Desmutting treatment was performed by spraying a desmutting solution with a spray for 2 seconds.

(d) Electrolytic Graining Treatment (Nitric Acid Electrolysis)

Electrolytic graining treatment was performed by applying trapezoidal wave current in a nitric acid electrolytic solution where aluminum ion concentration was controlled at 0.5 wt % by adding aluminum nitrate to a nitric acid aqueous solution with nitric acid concentration of 1 wt % at a solution temperature of 40° C. The frequency of the aforementioned trapezoidal wave current was 60Hz, quantity of electricity at the time of anodic reaction in the aforementioned aluminum plate was 197 C/dm$^2$ and current density at the peak time of AC and at the time of anodic reaction in the aluminum plate was 25 A/dm$^2$. Duty (ratio of time at the time of anode and to cycle in the aluminum plate) of AC was 0.5, and rise time was 0.3 msec. The ratio Qc/Qa of sum Qa of quantity of electricity at the time of anodic reaction and sum Qc of quantity of electricity at the time of cathodic reaction at the position of the aluminum plate opposite to the main carbon electrode was 0.95. The quantity of electricity applied to the aluminum plate was the quantity of electricity applied to the aluminum plate while the aluminum plate passed through the electrolytic bath and was the sum of the quantity of electricity where anodic reaction was performed on the aforementioned aluminum plate.

The nitric acid concentration of the aforementioned nitric acid electrolytic solution was controlled by measuring the sonic velocity and conductivity of the aforementioned nitric acid electrolytic solution at certain intervals of time and by replenishing concentrated nitric acid or water so as to allow the variation width between the aforementioned sonic velocity and conductivity to be within ±10%.

(e) Alkali Etching Treatment

Alkali etching treatment was performed by spraying an alkali solution (35° C.) containing NaOH of 26 wt % and aluminum ion of 5 wt % to the aluminum plate after electrolytic graining treatment (d) from a spray tube so as to allow the aluminum meltage to be 3.8 g/m$^2$ on the grained surface.

(f) Desmutting Treatment

Desmutting treatment was performed by spraying an acid aqueous solution with sulfuric acid concentration of 25 wt % at a temperature of 30° C. with a spray for 2 seconds.

(g) Electrolytic Graining Treatment (Hydrochloric Acid Electrolysis)

Condition (g-1): Electrolytic graining treatment was performed by applying trapezoidal wave current in a hydrochloric acid electrolytic solution where aluminum ion concentration was 4.5 g/L and hydrochloric acid concentration was 5.0 g/L at a solution temperature of 35° C. The frequency of the aforementioned trapezoidal wave current was 60 Hz, quantity of electricity at the time of anodic reaction in the aforementioned aluminum plate was 60 C/dm$^2$ and current density at the peak time of AC and at the time of anodic reaction in the aluminum plate was 30 A/dm$^2$. Duty (ratio of time at the time of anode and to cycle in the aluminum plate) of AC was 0.5, and rise time was 0.5 msec. The ratio Qc/Qa of sum Qa of quantity of electricity at the time of anodic reaction and sum Qc of quantity of electricity at the time of cathodic reaction at the position of the aluminum plate opposite to the main carbon electrode was 0.95. The quantity of electricity applied to the aluminum plate was the quantity of electricity applied to the aluminum plate while the aluminum plate passed through the electrolytic bath and was the sum of the quantity of electricity where anodic reaction was performed on the aforementioned aluminum plate.

The hydrochloric acid concentration of the aforementioned hydrochloric acid electrolytic solution was controlled by measuring the sonic velocity and conductivity of the aforementioned hydrochloric acid electrolytic solution at certain intervals of time and by replenishing concentrated hydrochloric acid or water so as to allow the variation width between the aforementioned sonic velocity and conductivity to be within ±10%.

Condition (g-2): Electrolytic graining treatment was performed by using a hydrochloric acid where hydrochloric acid concentration was 5.5 g/L and aluminum ion concentration was 4.5 g/L, controlling the quantity of electricity at the time of anodic reaction in the aforementioned aluminum plate at 65 C/dm$^2$ and under the conditions which are the same as the aforementioned conditions (g-1) other than the foregoing conditions.

(h) Alkali Etching Treatment

Condition (h-1): Alkali etching treatment was performed by spraying an alkali solution (45° C.) containing NaOH of 5 wt % and aluminum ion of 0.5 wt % to the aluminum plate after electrolytic graining treatment (g) from a spray tube so as to allow the aluminum meltage to be 0.2 g/m$^2$ on the grained surface.

Condition (h-2): Alkali etching treatment was performed in a similar manner to the aforementioned Condition (h-1), except that the aluminum meltage was set at 0.1 g/m$^2$.

(i) Desmutting Treatment

Desmutting treatment was performed by spraying an acid aqueous solution with sulfuric acid concentration of 25 wt % at a temperature of 60° C. with a spray for 4 seconds.

(j) Anodizing Treatment

As an electrolytic solution, a sulfuric acid aqueous solution at a temperature of 38° C. with sulfuric acid concentration of 15 wt % (containing aluminum ion of 0.5 wt %) was used. Continuous DC electrolysis was performed so as to allow the final anodizing layer quantity to be 2.5 g/$m^2$.

(k) Silicate Treatment

Dipping treatment was performed in No. 3 sodium silicate aqueous solution ($Na_2O$:$SiO_2$=1:3, $SiO_2$ content: 30 wt %, made by Nippon Chemical Industrial Co., Ltd., concentration: 1 wt %) at 35° C. for 10 seconds. The final Si atom adhesion quantity was 3.5 mg/$m^2$.

TABLE 2

| | | Graining treatment conditions | | |
|---|---|---|---|---|
| | Aluminum plate | (a) Mechanical graining treatment | (b) Electrolytic graining treatment | (c) Alkali etching treatment |
| Example 1 | Al-1 | a-1 | g-1 | h-1 |
| Example 2 | Al-2 | a-1 | g-1 | h-1 |
| Example 3 | Al-3 | a-1 | g-1 | h-1 |
| Example 4 | Al-4 | a-1 | g-1 | h-1 |
| Example 5 | Al-5 | a-1 | g-1 | h-1 |
| Example 6 | Al-6 | a-1 | g-1 | h-1 |
| Example 7 | Al-7 | a-1 | g-1 | h-1 |
| Example 8 | Al-8 | a-1 | g-1 | h-1 |
| Example 9 | Al-9 | a-1 | g-1 | h-1 |
| Example 10 | Al-10 | a-1 | g-1 | h-1 |
| Example 11 | Al-11 | a-1 | g-1 | h-1 |
| Example 12 | Al-12 | a-1 | g-1 | h-1 |
| Example 13 | Al-13 | a-1 | g-1 | h-1 |
| Example 14 | Al-14 | a-1 | g-1 | h-1 |
| Example 15 | Al-15 | a-1 | g-1 | h-1 |
| Example 16 | Al-16 | a-1 | g-1 | h-1 |
| Example 17 | Al-17 | a-1 | g-1 | h-1 |
| Example 18 | Al-18 | a-1 | g-1 | h-1 |
| Example 19 | Al-19 | a-1 | g-1 | h-1 |
| Example 20 | Al-20 | a-1 | g-1 | h-1 |
| Example 21 | Al-21 | a-1 | g-1 | h-1 |
| Example 22 | Al-22 | a-1 | g-1 | h-1 |
| Example 23 | Al-23 | a-1 | g-1 | h-1 |
| Example 24 | Al-1 | a-2 | g-1 | h-1 |
| Example 25 | Al-1 | a-1 | g-2 | h-1 |
| Example 26 | Al-1 | a-1 | g-1 | h-2 |
| Comparative Example 1 | Al-24 | a-1 | g-1 | h-1 |
| Comparative Example 2 | Al-25 | a-1 | g-1 | h-1 |
| Comparative Example 3 | Al-26 | a-1 | g-1 | h-1 |
| Comparative Example 4 | Al-27 | a-1 | g-1 | h-1 |
| Comparative Example 5 | Al-28 | a-1 | g-1 | h-1 |
| Comparative Example 6 | Al-29 | a-1 | g-1 | h-1 |
| Comparative Example 7 | Al-30 | a-1 | g-1 | h-1 |
| Comparative Example 8 | Al-31 | a-1 | g-1 | h-1 |
| Comparative Example 9 | Al-32 | a-1 | g-1 | h-1 |
| Comparative Example 10 | Al-25 | a-3 | g-1 | h-1 |
| Comparative Example 11 | Al-29 | a-3 | g-1 | h-1 |

2. Measurement of the Factors Representing the Surface Shape of the Support for the Lithographic Printing Plate Each of the factors was measured by the following method. The results are shown in Table 3. The surface area ratio and steepness are expressed as a percentage in Table 3.

(1) Measurement of Surface Area Ratio and Steepness (i) to (vi) with Atomic Force Microscope The surface area ratio was measured with the atomic force microscope (Atomic Force Microscope (AMF), SP13700, made by Seiko Instruments Inc.,) to find a three-dimensional data. Measurement was performed by following method.

Namely, a piece of 1 cm square in size was cut off from the support for the lithographic printing plate, the piece was set at the horizontal specimen block on the piezo scanner, a cantilever was allowed to approach the surface of the specimen for the cantilever to reach an area where an atomic force works, and then scanning was performed in XY directions. In this case, the asperities of the specimen were captured as the piezo scanner's displacement in Z direction. The piezo scanner capable of scanning in 150 μm in XY directions and 10 μm in Z direction was used. The cantilever with resonance frequency of 120 to 400 kHz and spring constant of 12 to 90 N/m (SI-DF20, made by Seiko Instruments Inc.,) was used, and the measurement was performed in DMF mode (dynamic force mode).

In addition, the subtle slant of the specimen was compensated by the least square estimate of the found three-dimensional data to find a reference plane.

The 512×512 points in 5 μm square on the surface were measured. The resolution in XY directions was set to 0.01 μm, the resolution in Z direction to 0.15 nm, and the scanning velocity to 5 μm/sec.

(i) $\Delta S^5$: The three-dimensional data (f (x, y)) obtained in the aforementioned (1) was used intact, the adjacent three points were extracted, the sum of the area of a fine triangle formed by the three points was found and was determined to be an actual area $S_x^5$. Surface area ratio $\Delta S^5$ was found by the following equation from the obtained actual area $S_x^5$ and geometrically measured area $S_0^5$.

$$\Delta S^5=[(S_x^5-S_0^5)/S_0^5]\times 100(\%)$$

(iv) $a45^5$: The three-dimensional data (f (x, y)) obtained in the aforementioned (1) was used intact to calculate an angle met by a fine triangle formed by the three points of each reference point and the adjacent two points in a predetermined direction (for example, the right and lower) and a reference plane relative to each reference point. The number of the reference points with gradient of 45° or more in the fine triangles was divided by the number of all the reference points (the number that the number of the points where the two adjacent points in a predetermined direction lack is deducted from 512×512 points which are the number of all the data, that is, 511×511 points) to calculate the surface area ratio $a45^5$ of an area with gradient of 45° or bigger.

(ii) $\Delta S^{5(0.2\text{-}5)}$: A component with wavelength of 0.2 μm or longer and 5 μm or shorter extracted from the three-dimensional data obtained by the aforementioned (1) was used. In order to extract the component with wavelength of 0.2 μm or longer and 5 μm or shorter, a frequency distribution was found by performing fast Fourier transform on the three-dimensional data obtained by the aforementioned (1), subsequently, after a component with wavelength of less than 0.2 μm was removed, an extraction was made by performing Fourier inverse transform.

The three-dimensional data (f (x, y)) obtained described above was used to extract the three adjacent points, the sum of the areas of the fine triangles formed by the three points was found and was determined to be actual area $S_x^{5(0.2-5)}$. Surface area ratio $\Delta S^{5(0.2-5)}$ was found by the following equation from actual area $S_x^{5(0.2-5)}$ and geometrically measured area $S_0^5$.

$$\Delta S^{5(0.2-5)}=[(S_x^{5(0.2-5)}-S_0^5)/S_0^5]\times 100(\%)$$

(v) $a45^{5(0.2-5)}$: The three-dimensional date (f (x, y)) found by performing Fourier inverse transform by the aforementioned (ii) was used to calculate $a45^{5(0.2-5)}$, in the same calculation as in the aforementioned (iv) $a45^5$.

(iii) $\Delta S^{5(0.02-0.2)}$: A component with wavelength of 0.02 µm or longer and 0.2 µm or shorter extracted from the three-dimensional data obtained by the aforementioned (1) was used. In order to extract the component with wavelength of 0.02 µm or longer and 0.2 µm or shorter, a frequency distribution was found by performing fast Fourier transform on the three-dimensional data obtained by the aforementioned (1), subsequently, after a component with wavelength of less than 0.02 µm and more than 0.2 µm was removed, an extraction was made by performing Fourier inverse transform.

The three-dimensional data (f (x, y)) obtained described above was used to extract the three adjacent points, the sum of the areas of the fine triangles formed by the three points was found and was determined to be actual area $S_x^{5(0.02-0.2)}$. Surface area ratio $\Delta S^{5(0.02-0.2)}$ was found by the following equation from actual area $S_x^{5(0.02-0.2)}$ and geometrically measured area $S_0^5$.

$$\Delta S^{5(0.02-0.2)}=[(S_x^{5(0.02-0.2)}-S_0^5)/S_0^5]\times 100(\%)$$

(vi) $a45^{5(0.02-0.2)}$: The three-dimensional date (f (x, y)) obtained by performing Fourier inverse transform by the aforementioned (iii) was used to calculate surface area ratio $a45^{5(0.02-0.2)}$, of the area with gradient of 45° or more in the same calculation as in the aforementioned (iv) $a45^5$.

(2) Measurement of Surface Area Ratio and Steepness (xi) to (xvi) with Atomic Force Microscope (AFM)

The surface shape was measured with AFM to find the three-dimensional data in the same manner as in the aforementioned (1). However, measurement was performed on 512×512 points in 50 µm square on the surface. The resolution of XY direction was determined to be 0.1 µm, the resolution of Z direction was determined to be 0.15 nm and scanning rate was 50 µm/sec.

(Xi) $\Delta S^{50}$: the three-dimensional data (f (x, y)) obtained in the aforementioned (2) was used intact, the adjacent three points were extracted, the sum of the area of a fine triangle formed by the three points was found and was determined to be an actual area $S_x^{50}$. Surface area ratio $\Delta S^{50}$ was found by the following equation from the obtained actual area $S_x^{50}$ and geometrically measured area $S_0^{50}$.

$$\Delta S^{50}=[(S_x^{50}-S_0^{50})/S_0^{50}]\times 100(\%)$$

(xiv) $a45^{50}$: The three-dimensional data (f (x, y)) obtained in the aforementioned (2) was used intact to calculate an angle met by a fine triangle formed by the three points of each reference point and the adjacent two points in a predetermined direction (for example, the right and lower) and a reference plane relative to each reference point. The number of the reference points with gradient of 45° or more in the fine triangles was divided by the number of all the reference points (the number that the number of the points where the two adjacent points in a predetermined direction lack is deducted from 512×512 points which are the number of all the data, that is, 511×511 points) to calculate the surface area ratio $a45^{50}$ of an area with gradient of 45° or bigger.

(xii) $\Delta S^{50(2-50)}$: A component with wavelength of 2 µm or longer and 50 µm or shorter extracted from the three-dimensional data obtained by the aforementioned (2) was used. In order to extract the component with wavelength of 2 µm or longer and 50 µm or shorter, a frequency distribution was found by performing fast Fourier transform on the three-dimensional data obtained by the aforementioned (2), subsequently, after a component with wavelength of less than 2 µm was removed, an extraction was made by performing Fourier inverse transform.

The three-dimensional data (f (x, y)) obtained described above was used to extract the three adjacent points, the sum of the areas of the fine triangles formed by the three points was found and was determined to be actual area $S_x^{50(2-50)}$. Surface area ratio $\Delta S^{50(2-50)}$ was found by the following equation from actual area $S_x^{50(2-50)}$ and geometrically measured area $S_0^{50}$.

$$\Delta S^{50(2-50)}=[(S_x^{50(2-50)}-S_0^{50})/S_0^{50}]\times 100(\%)$$

(xv) $a45^{50(2-50)}$: The three-dimensional date (f (x, y)) found by performing Fourier inverse transform by the aforementioned (xii) was used to calculate $a45^{50(2-50)}$, in the same calculation as in the aforementioned (xiv) $a45^{50}$.

(xiii) $\Delta S^{50(0.2-2)}$: A component with wavelength of 0.2 µm or longer and 2 µm or shorter extracted from the three-dimensional data obtained by the aforementioned (2) was used. In order to extract the component with wavelength of 0.2 µm or longer and 2 µm or shorter, a frequency distribution was found by performing fast Fourier transform on the three-dimensional data obtained by the aforementioned (2), subsequently, after a component with wavelength of less than 0.2 µm and more than 2 µm was removed, an extraction was made by performing Fourier inverse transform.

The three-dimensional data (f (x, y)) obtained described above was used to extract the three adjacent points, the sum of the areas of the fine triangles formed by the three points was found and was determined to be actual area $S_x^{50(0.2-2)}$. Surface area ratio $\Delta S^{50(0.2-2)}$ was found by the following equation from actual area $S_x^{50(0.2-2)}$ and geometrically measured area $S_{hu\ 50}$.

$$\Delta S^{50(0.2-2)}=[(S_x^{50(0.2-2)}-S_0^{50})/S_0^{50}]\times 100(\%)$$

(xvi) $a45^{50(0.2-2)}$: The three-dimensional date (f (x, y)) obtained by performing Fourier inverse transform by the aforementioned (xiii) was used to calculate surface area ratio $a45^{50(0.2-2)}$, of the area with gradient of 45° or more in the same calculation as in the aforementioned (xiv) $a45^{50}$.

(3) Measurement of the Number of Local Deep Areas with a Depth of 5 µm or More Existent on the Surface of the Support for the Lithographic Printing Plate A 400 µm×400 µm portion of the surface was scanned in a non-contact manner at resolution of 0.01 µm with a laser microscope (Micromap520, made by Ryoka Systems Inc.) to obtain three-dimensional data, and the local deep areas with a depth of 5 µm or more were counted based on the three-dimensional data. The same procedure was performed on 5 portions and the average value of the counts was considered to be the number of the aforementioned local deep areas.

The result was shown in Table 3. The number of the local deep areas with a depth of 5 µm or more existent on 400 µm×400 µm surface was indicated as "Number of deep areas" in Tables 3. The unit of the number of the local deep areas is "particles".

In addition to the laser microscope as used above, for example, made by Keyence Corporation, ultra-deep profile measurement microscope VK5800 can be similarly used.

TABLE 3

(No. 1)

| | $\Delta S^5$ | $\Delta S^{5(0.2-5)}$ | $\Delta S^{5(0.02-0.2)}$ | $a45^5$ | $a45^{5(0.2-5)}$ | $a45^{5(0.02-0.2)}$ |
|---|---|---|---|---|---|---|
| Example 1 | 58 | 19 | 49 | 41 | 11 | 36 |
| Example 2 | 61 | 22 | 47 | 40 | 13 | 37 |
| Example 3 | 60 | 20 | 50 | 42 | 13 | 39 |
| Example 4 | 59 | 17 | 59 | 40 | 12 | 40 |
| Example 5 | 58 | 26 | 58 | 48 | 20 | 38 |
| Example 6 | 49 | 25 | 57 | 42 | 18 | 35 |
| Example 7 | 52 | 25 | 55 | 40 | 17 | 32 |
| Example 8 | 57 | 20 | 54 | 43 | 13 | 30 |
| Example 9 | 56 | 20 | 54 | 42 | 13 | 29 |
| Example 10 | 52 | 15 | 44 | 43 | 8 | 21 |
| Example 11 | 68 | 25 | 70 | 44 | 16 | 60 |
| Example 12 | 68 | 24 | 66 | 47 | 15 | 51 |
| Example 13 | 67 | 22 | 63 | 45 | 15 | 48 |
| Example 14 | 62 | 23 | 60 | 42 | 12 | 45 |
| Example 15 | 60 | 22 | 55 | 39 | 12 | 40 |
| Example 16 | 54 | 21 | 48 | 26 | 11 | 32 |
| Example 17 | 45 | 20 | 40 | 22 | 11 | 28 |
| Example 18 | 47 | 13 | 44 | 23 | 6 | 29 |
| Example 19 | 46 | 14 | 48 | 25 | 6 | 30 |
| Example 20 | 47 | 15 | 51 | 25 | 8 | 31 |
| Example 21 | 42 | 18 | 53 | 24 | 11 | 32 |
| Example 22 | 48 | 20 | 46 | 29 | 14 | 30 |
| Example 23 | 47 | 21 | 42 | 26 | 14 | 28 |
| Example 24 | 62 | 19 | 51 | 40 | 11 | 36 |
| Example 25 | 65 | 21 | 59 | 49 | 14 | 48 |
| Example 26 | 55 | 16 | 45 | 39 | 8 | 33 |
| Comparative Example 1 | 57 | 16 | 42 | 41 | 11 | 28 |
| Comparative Example 2 | 50 | 20 | 48 | 35 | 13 | 37 |
| Comparative Example 3 | 28 | 8 | 35 | 24 | 6 | 25 |
| Comparative Example 4 | 65 | 18 | 45 | 40 | 10 | 33 |
| Comparative Example 5 | 40 | 9 | 53 | 20 | 8 | 35 |
| Comparative Example 6 | 75 | 28 | 71 | 56 | 15 | 61 |
| Comparative Example 7 | 37 | 8 | 57 | 19 | 11 | 44 |
| Comparative Example 8 | 49 | 28 | 45 | 32 | 21 | 30 |
| Comparative Example 9 | 29 | 9 | 40 | 19 | 6 | 31 |
| Comparative Example 10 | 62 | 23 | 56 | 48 | 11 | 40 |
| Comparative Example 11 | 71 | 31 | 65 | 54 | 22 | 51 |

TABLE 3

(No. 2)

| | $\Delta S^{50}$ | $\Delta S^{50(2-50)}$ | $\Delta S^{50(0.2-2)}$ | $a45^{50}$ | $a45^{50(2-50)}$ | $a45^{50(0.2-2)}$ | Number of deep area |
|---|---|---|---|---|---|---|---|
| Example 1 | 48 | 6 | 30 | 43 | 0.1 | 27 | 0.2 |
| Example 2 | 40 | 6 | 25 | 37 | 0.2 | 22 | 0.2 |
| Example 3 | 45 | 7 | 26 | 40 | 0.3 | 20 | 0.2 |
| Example 4 | 44 | 6 | 30 | 38 | 0.4 | 24 | 0.2 |
| Example 5 | 42 | 7 | 28 | 40 | 0.4 | 23 | 0.7 |
| Example 6 | 44 | 7 | 28 | 36 | 0.5 | 22 | 0.6 |
| Example 7 | 42 | 7 | 21 | 38 | 0.4 | 17 | 0.7 |
| Example 8 | 42 | 6 | 21 | 35 | 0.5 | 17 | 0.5 |
| Example 9 | 40 | 6 | 19 | 35 | 0.3 | 14 | 0.5 |
| Example 10 | 65 | 6 | 16 | 33 | 0.3 | 11 | 0.5 |
| Example 11 | 58 | 10 | 35 | 59 | 2.5 | 30 | 0.6 |
| Example 12 | 49 | 9 | 32 | 57 | 1.8 | 27 | 0.6 |
| Example 13 | 51 | 8 | 28 | 42 | 1.0 | 23 | 0.4 |
| Example 14 | 44 | 7 | 27 | 47 | 0.7 | 23 | 0.3 |
| Example 15 | 39 | 6 | 26 | 37 | 0.7 | 21 | 0.2 |

TABLE 3-continued (No. 2)

| | $\Delta S^{50}$ | $\Delta S^{50(2-50)}$ | $\Delta S^{50(0.2-2)}$ | $a45^{50}$ | $a45^{50(2-50)}$ | $a45^{50(0.2-2)}$ | Number of deep area |
|---|---|---|---|---|---|---|---|
| Example 16 | 30 | 5 | 24 | 33 | 0.4 | 20 | 0.3 |
| Example 17 | 45 | 5 | 22 | 25 | 0.4 | 17 | 0.3 |
| Example 18 | 42 | 6 | 28 | 38 | 0.3 | 22 | 0.4 |
| Example 19 | 47 | 6 | 28 | 38 | 0.2 | 21 | 0.4 |
| Example 20 | 47 | 6 | 20 | 42 | 0.2 | 15 | 0.3 |
| Example 21 | 40 | 6 | 16 | 40 | 0.4 | 13 | 0.5 |
| Example 22 | 41 | 7 | 30 | 37 | 0.2 | 28 | 0.3 |
| Example 23 | 34 | 6 | 34 | 36 | 0.3 | 30 | 0.5 |
| Example 24 | 42 | 6 | 22 | 29 | 0.4 | 16 | 0.4 |
| Example 25 | 47 | 6 | 27 | 37 | 0.3 | 21 | 0.3 |
| Example 26 | 42 | 6 | 29 | 43 | 1.0 | 25 | 0.2 |
| Comparative Example 1 | 45 | 5 | 27 | 36 | 0.7 | 21 | 0.2 |
| Comparative Example 2 | 40 | 7 | 27 | 39 | 0.4 | 22 | 1.5 |
| Comparative Example 3 | 48 | 6 | 13 | 38 | 0.1 | 9 | 0.5 |
| Comparative Example 4 | 30 | 7 | 41 | 40 | 0.6 | 42 | 1.8 |
| Comparative Example 5 | 30 | 5 | 14 | 24 | 0.1 | 10 | 0.5 |
| Comparative Example 6 | 65 | 10 | 37 | 57 | 2.5 | 35 | 1.5 |
| Comparative Example 7 | 29 | 7 | 12 | 26 | 1.0 | 10 | 0.3 |
| Comparative Example 8 | 41 | 6 | 42 | 33 | 0.3 | 30 | 1.0 |
| Comparative Example 9 | 40 | 6 | 14 | 36 | 0.5 | 8 | 0.7 |
| Comparative Example 10 | 48 | 9 | 36 | 42 | 1.5 | 45 | 2.0 |
| Comparative Example 11 | 72 | 11 | 44 | 65 | 3.3 | 46 | 5.0 |

3.Preparation of Presensitized Plate

The presensitized plate was obtained by providing an image recording layer of the thermal positive type which has a two-layer structure on the support for the lithographic printing plate obtained above.

<An Image Recording Layer>

The undercoat layer coating solution I with the following composition was coated on the supports and dried at 80° C. for 30 seconds. The coated quantity after drying was 30 mg/m$^2$.

| <Composition of undercoat layer coating solution I> | |
|---|---|
| The high-molecular compound A expressed by the following formula | 0.3 g |
| Methanol | 100 g |
| Water | 1 g |

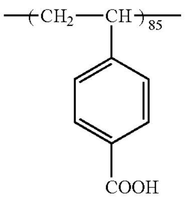

-continued

<Composition of undercoat layer coating solution I>

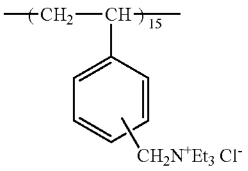

MOLECULAR WEIGHT 28,000

A thermosensitive layer coating solution A with the following composition was coated on the undercoat layer and the coating solution A was dried at 140° C. for 50 seconds with Wind Control set at 7 on PERFECT OVEN PH200 made by TABAI Co., Ltd. to form the thermosensitive layer A. The coated quantity after drying was 0.85 g/m$^2$.

| <Composition of thermosensitive layer coating solution A > | |
|---|---|
| Copolymer of N-(4-aminosulpfonyl)methacrylamide/acrylonitrile/methyl methacrylate (mol ratio: 36/34/30, weight average molecular weight 50,000) | 1.896 g |

-continued

| <Composition of thermosensitive layer coating solution A > | |
|---|---|
| Cresol novolak resin (m/p ratio = 6/4, weight average molecular weight 4,500, 0.8 wt % of residual monomer) | 0.237 g |
| Cyanine dye A expressed by the following formula | 0.109 g |
| 4,4'-bis hydroxyphenylsulfone | 0.063 g |
| Tetrahydrophthalic anhydride | 0.190 g |
| p-toluenesulfonic acid | 0.008 g |
| A compound prepared by setting a counter ion of ethyl violet as 6-hydroxynaphthalene sulfone | 0.05 g |
| Fluorine-containing surfactant (Megafac F-176, made by Dainippon Ink And Chemicals, Incorporated) | 0.035 g |
| Methyl ethyl ketone | 26.6 g |
| 1-methoxy-2-propanol | 13.6 g |
| γ-butyllactone | 13.8 g |

CYANINE DYE A

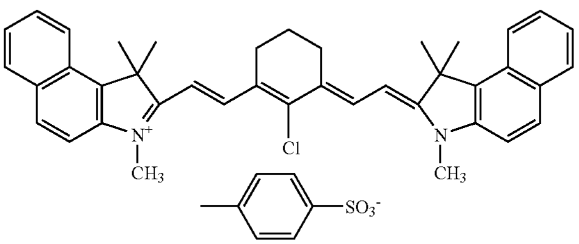

Therefore, a thermosensitive layer coating solution B with following composition was coated on the thermosensitive layer A and a superimposed layer type thermosensitive layer was formed by drying the coating solution B at 120° C. for one minute to obtain a presensitized plate. The coated quantity of the thermosensitive layer B after drying was 0.15 $g/m^2$.

| <Composition of thermosensitive layer coating solution B> | |
|---|---|
| m, p-cresol novolak resin (m/p ratio = 6/4, weight average molecular weight 4,500, containing 0.8 wt % of unreacted cresol) | 0.237 g |
| Cyanine dye A expressed by the aforementioned formula | 0.047 g |
| Dodecyl stearate | 0.060 g |
| 3-methoxy-4-diazodiphenylaminehexafluorophosphate | 0.030 g |
| Fluorine-containing surfactant (Megafac F-176, made by Dainippon Ink And Chemicals, Incorporated) | 0.110 g |
| Fluorine-containing surfactant (Megaface MCF-312 (30 wt %), made by Dainippon Ink And Chemicals,) | 0.120 g |
| Methyl ethyl ketone | 15.1 g |
| 1-methoxy-2-pronanol | 7.7 g |

4. Exposure and Development Treatment

Exposure and development treatment were performed on each of the presensitized plates obtained above in the following method to obtain the lithographic printing plate.

Image-wise exposure was performed at a main scanning rate of 5 m/sec. and in plate-surface energy quantity of 140 $mJ/cm^2$ with Creo Co., Ltd-made TrendSetter 3244 equipped with a semiconductor laser with output of 500 mW, wavelength 830 nm and beam diameter of 17 μm ($1/e^2$).

Thereafter, development treatment was performed by using an alkali developer where the compound $C_{12}H_{25}N(CH_2CH_2COONa)_2$ of 1.0 g was added to 1 liter of an aqueous solution containing potassium salt of 5.0 wt % including D-sorbitol/potassium oxide ($K_2O$) in which a non-reducing sugar and a base were combined, and an antifoaming agent (olfin AK-02, made by Nissin Chemical Industry Co., Ltd.). Development treatment was performed under the conditions of a development temperature of 25° C. for 12 seconds by using automatic processor PS900NP (made by Fuji Photo Film Co., Ltd.) filled with developer. After the development treatment was completed, and rinsing process done, a treatment was performed on the plate with gum (GU-7 (1:1)) or the like to obtain the lithographic printing plate with plate making completed.

5. Evaluation of Presensitized Plate or Lithographic Printing Plate

For the lithographic printing plate obtained above, existence or non-existence of exposure defect (sensitivity), cleaner press life, scum resistance (scum of a blanket), fatigue fracture strength, and press life, and for the presensitized plate obtained above, scratch resistance were evaluated in the following method.

The results of sensitivity, scum resistance, cleaner press life, scratch resistance, and fatigue fracture strength were shown in Table 4.

(1) Sensitivity: Existence or Non-Existence of Exposure Defect

Existence or non-existence of exposure defect in each lithographic printing plate was evaluated by visually observing the occurrence frequency of dot exposure defective areas (existence or non-existence of dot residual layers and its extent) in the lithographic printing plate on which exposure and development treatment was performed described above. The three-step evaluation of ◎, ○ and x was conducted according to the extent of exposure defect (the aforementioned occurrence frequency). Above ○ are allowable.

(2) Scum Resistance

Scum resistance is evaluated by the scum of a blanket.

Printing was performed on the lithographic printing plate obtained as above, with DIC-GEOS(s) magenta ink by Mitsubishi Diamond Type F2 printing machine (made by Mitsubishi Heavy industries, Ltd.), and the scum of a blanket after printing of 10,000 sheets had been performed was once transferred into a scotch tape (trademark), which was affixed to a white paper, and the amount of ink transferred on the scotch tape (trademark) was visually inspected for evaluation.

The results were graded 6-steps as ◎, ○, ○Δ, Δ, Δx and x in the order of increasing the stain thereof.

Above Δ are allowable.

(3) Cleaner Press Life

Printing was performed using F-Gloss 85 ink made by Dainippon Ink and Chemicals, Inc. with a printing machine SPRINT made by Komori Corporation, and cleaner press life was evaluated by the impression number. The solid image area was cleaned every 5,000 prints with a plate cleaner solution (MULTI-CLEANER, made by Fuji Photo Film Co., Ltd.) using a sponge, and cleaner press life was evaluated by the impression number at a time when the solid image area became light and faint, which was visually recognized.

Incidentally, cleaner press life is indicated in a relative value, when the cleaner press life in Comparative Example 1 is assumed to be 100.

(4) Press Life

Printing was performed on the lithographic printing plate on which exposure and development treatment was performed described above by using Komori Corporation-made SPRINT printing press as a printing press, F-Gloss 85 black ink (N) as an ink and a solution where isopropanol was added to Fuji Photo Film Co., Ltd.-made EU-3 (1%) so as to allow isopropanol to be 10 wt % to the whole weight as a fountain solution.

Evaluation was performed by the number of printed sheets until what the solid image area begun light and faint was recognized by visual observation.

Note that in the Examples, each was of a large number of printed sheets compared with printed sheets in Comparative Example 1, and excellent press life could be realized.

(5) Scratch Resistance

Ten sheets for each presensitized plate obtained above were prepared and were piled up. Then, they were left for 7 days. Thereafter, local fine dotted scratches left on the photosensitive layers of the presensitized plates by contacting the back sides of other presensitized plates piled up were visually observed.

The extent of occurrence of the dotted scratches was evaluated in the five steps of ○, ○Δ, Δ, Δx and x in the order from the small number of scratches. Above ○Δ are allowable.

Note that no treatment was performed on the back side of the aforementioned presensitized plate and the surface of the aluminum plate at the time of manufacturing the aluminum plate remained intact.

(6) Fatigue Fracture Strength

For each presensitized plate obtained above, using a laser writing device (Trendsetter, CREO Inc.-made), development treatment was performed by printing the dot image areas on the entire surface so as to allow the area of the image area to be 50% of the entire area. Each 10 samples with width of 20 mm and length of 100 mm were cut off from the obtained lithographic printing plates.

Thereafter, a light tension was given so as to allow the tension per cross section to be about 1.0 kg/mm$^2$, after one end was fixed, an oscillation was given so as to allow the amplitude of the other end to be about 5 mm, fatigue fracture strength was found by measuring the number of the oscillation until the plate was broken.

The evaluation was made in the five steps of ◎, ○, Δ, Δx and x in the order from the strongest fatigue fracture strength.

Above Δ are allowable.

TABLE 4

| | Sensitivity | Scum resistance | Cleaner press life | Scratch resistance | Fatigue fracture strength |
|---|---|---|---|---|---|
| Example 1 | ◎ | ○ | 100 | ○ | ○ |
| Example 2 | ◎ | ○ | 100 | ○ | ○ |
| Example 3 | ◎ | ○ | 110 | ○ | Δ |
| Example 4 | ◎ | ○ | 130 | ○ | ○ |
| Example 5 | ○ | ○ | 130 | ○ | ○ |
| Example 6 | ○ | ○ | 130 | ○ | ○ |
| Example 7 | ○ | ◎ | 120 | ○ | ○ |
| Example 8 | ◎ | ◎ | 120 | ○ | ○ |
| Example 9 | ◎ | ◎ | 120 | ○ | ○ |
| Example 10 | ◎ | ◎ | 100 | ○ | ○ |
| Example 11 | ○ | Δ | 150 | ◎ | ◎ |
| Example 12 | ○ | ○ | 140 | ◎ | ◎ |
| Example 13 | ◎ | ○ | 140 | ◎ | ◎ |
| Example 14 | ◎ | ○ | 130 | ◎ | ◎ |
| Example 15 | ◎ | ○ | 120 | ○ | ○ |
| Example 16 | ◎ | ○ | 100 | ○ | ○ |
| Example 17 | ◎ | ◎ | 100 | ○ | ○ |
| Example 18 | ◎ | ○ | 100 | ○ | ○ |
| Example 19 | ◎ | ○ | 100 | ○ | ○ |
| Example 20 | ◎ | ◎ | 110 | ○ | ○ |
| Example 21 | ◎ | ◎ | 110 | ○ | ○ |

TABLE 4-continued

| | Sensitivity | Scum resistance | Cleaner press life | Scratch resistance | Fatigue fracture strength |
|---|---|---|---|---|---|
| Example 22 | ◎ | ○ | 100 | ○ | ○ |
| Example 23 | ◎ | Δ | 100 | ○ | ○ |
| Example 24 | ◎ | ○ | 110 | ○ | ○ |
| Example 25 | ◎ | ○ | 115 | ○ | ○ |
| Example 26 | ◎ | ○ | 100 | ○ | ○ |
| Comparative Example 1 | ◎ | ○ | 100 | ○ | x |
| Comparative Example 2 | x | ○ | 100 | Δ | ○ |
| Comparative Example 3 | ○ | ◎ | 70 | ○ | ○ |
| Comparative Example 4 | x | x | 100 | ○ | ○ |
| Comparative Example 5 | ○ | x | 90 | ○ | ○ |
| Comparative Example 6 | x | x | 150 | ○Δ | ◎ |
| Comparative Example 7 | ◎ | x | 80 | ○Δ | ○ |
| Comparative Example 8 | x | Δ | 90 | ○ | ○ |
| Comparative Example 9 | ○ | ◎ | 80 | ○ | ○ |
| Comparative Example 10 | x | x | 110 | Δ | ○ |
| Comparative Example 11 | x | x | 140 | x | ◎ |

As shown in Table 4, the support for a lithographic printing plate (Examples 1 to 26) according to the present invention where the aluminum plate having the specified composition is used and the factors representing the surface shape satisfies the specified conditions and the presensitized plate using the same are excellent in printing performance (press life, scum resistance, sensitivity and cleaner press life or the like) and handling property (scratch resistance, fatigue fracture strength or the like) when the lithographic printing plate is prepared.

In addition, if the number of the specified deep areas having on the surface stays within the range of the present invention, the presensitized plate is more excellent in sensitivity when the lithographic printing plate is prepared.

On the contrary, unless the contents of the specified elements contained in the aluminum plate and at least one of the factors representing the surface shape satisfy the range or the conditions of the present invention, the support for a lithographic printing plate and presensitized plate using the same are poor in any one or more of printing performance (press life, scum resistance, sensitivity and cleaner press life or the like) and handling property (scratch resistance, fatigue fracture strength or the like) when the lithographic printing plate is prepared.

[Effect of the Invention]

The present invention can provide the presensitized plate excellent in printing performance (press life, scum resistance, sensitivity and cleaner press life or the like) and handling property (scratch resistance, fatigue fracture strength or the like) when the lithographic printing plate is prepared and the support for a lithographic printing plate used for the same.

In addition, the present invention can provide the presensitized plate which has the aforementioned characteristics even if a laser exposed type image recording layer is used and can be treated with a developer containing no alkali metal silicate, the support for a lithographic printing plate used for the same and a method of treating the presensitized plate.

The invention claimed is:

1. A support for a lithographic printing plate obtained by performing graining treatment including electrochemical graining treatment on an aluminum plate, wherein said aluminum plate is an aluminum plate which is manufactured by a method including molten metal treatment, and contains Fe of 0.20 to 0.29 wt %, Si of 0.03 to 0.15 wt %, Cu of 0.032 to 0.040 wt % and Ti of 0.050 wt % or less and whose remaining portion is composed of Al and unavoidable impurities, and wherein surface area ratio and steepness obtained from three-dimensional data by measuring 512×512 points in 5 μm×5 μm on the surface with an atomic force microscope each satisfies the following conditions (i) to (vi):

(i) surface area ratio $\Delta S^5$ is 30 to 70%;

(ii) surface area ratio $\Delta S^{5(0.2\text{-}5)}$ is 10 to 30%;

(iii) surface area ratio $\Delta S^{5(0.02\text{-}0.2)}$ is 30 to 70%;

(iv) steepness $a45^5$ is 20 to 50%;

(v) steepness $a45^{5(0.2\text{-}5)}$ is 5 to 20%; and (vi) steepness $a45^{5(0.02\text{-}0.2)}$ is 20 to 60%, wherein $\Delta S^5$ which is found by the following equation from actual area $S_x^5$ found by an approximation three-point method from said three-dimensional data and geometrically measured area $S_0^5$ is surface area ratio expressed by $\Delta S^5=[(S_x^5-S_0^5)/S_0^5]\times100(\%)$;

$\Delta S^{5(0.2\text{-}5)}$ which is found by the following equation from actual area $S_x^{5(0.2\text{-}5)}$ obtained by extracting a component with wavelength of 0.2 μm or longer and 5 μm or shorter from said three-dimensional data and geometrically measured area $S_0^5$ is surface area ratio expressed by $\Delta S^{5(0.2\text{-}5)}=[(S_x^{5(0.2\text{-}5)}-S_0^5)/S_0^5]\times100(\%)$;

$\Delta S^{5(0.02\text{-}0.2)}$ which is found by the following equation from actual area $S_x^{5(0.02\text{-}0.2)}$ obtained by extracting a component with wavelength of 0.02 μm or longer and 0.2 μm or shorter from said three-dimensional data and geometrically measured area $S_0^5$ is surface area ratio expressed by $\Delta S^{5(0.02\text{-}0.2)}=[(S_x^{5(0.02\text{-}0.2)}-S_0^5)/S_0^5]\times100(\%)$;

steepness $a45^5$ is an area rate of a portion (area) having a slant with size of angle of 45° or bigger (gradient of 45° or bigger) to actual area $S_x^5$ found by approximation three-point method from said three-dimensional data;

steepness $a45^{5(0.2\text{-}5)}$ is an area rate of a portion (area) having a slant with size of angle of 45° or bigger (gradient of 45° or bigger) to actual area $S_x^{5(0.2\text{-}5)}$ found by extracting a component with wavelength of 0.2 μm or longer and 5 μm or shorter from said three-dimensional data; and steepness $a45^{5(0.02\text{-}0.2)}$ is an area rate of a portion (area) having a slant with size of angle of 45° or bigger (gradient of 45° or bigger) to actual area $S_x^{5(0.02\text{-}0.2)}$ found by extracting a component with wavelength of 0.02 μm or longer and 0.2 μm or shorter from said three-dimensional data.

2. The support for a lithographic printing plate according to claim 1, wherein the number of local deep areas with a depth of 5 μm or more existent on the surface is 1.0 or less per 400 μm×400 μm.

3. The support for a lithographic printing plate according to claim 2, wherein Si atom attached quantity on the surface is 0.1 to 30 mg/m$^2$.

4. A presensitized plate provided with an image recording layer on the support for a lithographic printing plate according to claim 3.

5. The presensitized plate according to claim 4, wherein the presensitized is a presensitized plate for a laser printing plate.

6. A presensitized plate provided with an image recording layer on the support for a lithographic printing plate according to claim 2.

7. The presensitized plate according to claim 6, wherein the presensitized is a presensitized plate for a laser printing plate.

8. The support for a lithographic printing plate according to claim 1, wherein Si atom attached quantity on the surface is 0.1 to 30 mg/m$^2$.

9. A presensitized plate provided with an image recording layer on the support for a lithographic printing plate according to claim 8.

10. The presensitized plate according to claim 9, wherein the presensitized is a presensitized plate for a laser printing plate.

11. A presensitized plate provided with an image recording layer on the support for a lithographic printing plate according to claim 1.

12. The presensitized plate according to claim 11, wherein the presensitized is a presensitized plate for a laser printing plate.

13. A support for a lithographic printing plate obtained by performing graining treatment including electrochemical graining treatment on an aluminum plate, wherein said aluminum plate is an aluminum plate which is manufactured by a method including molten metal treatment, contains Fe of 0.20 to 0.29 wt %, Si of 0.03 to 0.15 wt %, Cu of 0.032 to 0.040 wt % and Ti of 0.050 wt % or less and whose remaining portion is composed of Al and unavoidable impurities, and wherein surface area ratio and steepness obtained from three-dimensional data by measuring 512×512 points in 50 μm×50 μm on the surface with an atomic force microscope each satisfies the following conditions (xi) to (xvi):

(xi) surface area ratio $\Delta S^{50}$ is 30 to 70%;

(xii) surface area ratio $\Delta S^{50(2\text{-}50)}$ is 5 to 10%;

(xiii) surface area ratio $\Delta S^{50(0.2\text{-}2)}$ is 15 to 40%;

(iv) steepness $a45^{50}$ is 25 to 60%;

(xv) steepness $a45^{50(2\text{-}50)}$ is 0 to 3.0%; and (xvi) steepness $a45^{50(0.2\text{-}2)}$ is 10 to 40%, wherein $\Delta S^{50}$ which is found by the following equation from actual area $S_x^{50}$ found by approximation three-point method from said three-dimensional data and geometrically measured area $S_0^{50}$ is surface area ratio expressed by $\Delta S^{50}=[(S^{50}-S_0^{50})/S_0^{50}]\times100(\%)$;

$\Delta S^{50(2\text{-}50)}$ which is found by the following equation from actual area $S_x^{50(2\text{-}50)}$ obtained by extracting a component with wavelength of 2 μm or longer and 50 μm or shorter from said three-dimensional data and geometrically measured area $S_0^{50}$ is surface area ratio expressed by $\Delta S^{50(2\text{-}50)}=[(S_x^{50(2\text{-}50)}-S_0^{50})/S_0^{50}]\times100(\%)$;

$\Delta S^{50(0.2\text{-}2)}$ which is found by the following equation from actual area $S_x^{50(0.2\text{-}2)}$ obtained by extracting a component with wavelength of 0.2 μm or longer and 2 μm or shorter from said three-dimensional data and geometrically measured area $S_0^{50}$ is surface area ratio expressed by $\Delta S^{50(0.2\text{-}2)}=[(S_x^{50(0.2\text{-}2)}-S_0^{50})/S_0^{50}]\times100(\%)$;

steepness $a45^{50}$ is an area rate of a portion (area) having a slant with size of angle of 45° or bigger (gradient of 45° or bigger) to actual area $S_x^{50}$ found by approximation three-point method from said three-dimensional data;

steepness $a45^{50(2-50)}$ is an area rate of a portion (area) having a slant with size of angle of 45° or bigger (gradient of 45° or bigger) to actual area $S_x^{50(2-50)}$ found by extracting a component with wavelength of 2 μm or longer and 50 μm or shorter from said three-dimensional data; and steepness $a45^{50(0.2-2)}$ is the area rate of a portion (area) having a slant with size of angle of 45° or bigger (gradient of 45° or bigger) to actual area $S_x^{50(0.2-2)}$ found by extracting a component with wavelength of 0.2 μm or longer and 2 μm or shorter from said three-dimensional data.

14. The support for a lithographic printing plate according to claim 13, wherein the number of local deep areas with a depth of 5 μm or more existent on the surface is 1.0 or less per 400 μm×400 μm.

15. A presensitized plate provided with an image recording layer on the support for a lithographic printing plate according to claim 14.

16. The presensitized plate according to claim 15, wherein the presensitized is a presensitized plate for a laser printing plate.

17. The support for a lithographic printing plate according to claim 13, wherein Si atom attached quantity on the surface is 0.1 to 30 mg/m$^2$.

18. A presensitized plate provided with an image recording layer on the support for a lithographic printing plate according to claim 17.

19. The presensitized plate according to claim 18, wherein the presensitized is a presensitized plate for a laser printing plate.

20. A presensitized plate provided with an image recording layer on the support for a lithographic printing plate according to claim 13.

21. The presensitized plate according to claim 20, wherein the presensitized is a presensitized plate for a laser printing plate.

22. A support for a lithographic printing plate obtained by performing graining treatment including electrochemical graining treatment on an aluminum plate, wherein said aluminum plate is an aluminum plate which is manufactured by a method including molten metal treatment, and contains Fe of 0.20 to 0.29 wt %, Si of 0.03 to 0.15 wt %, Cu of 0.032 to 0.040 wt % and Ti of 0.050 wt % or less and whose remaining portion is composed of Al and unavoidable impurities, wherein said electrochemical graining treatment is performed in order of nitric acid electrolytic graining and hydrochloric acid graining, and wherein surface area ratio and steepness obtained from three-dimensional data by measuring 512×512 points in 5 μm×5 μm on the surface with an atomic force microscope each satisfies the following conditions (i) to (vi):

(i) surface area ratio $\Delta S^5$ is 30 to 70%;

(ii) surface area ratio $\Delta S^{5(0.2-5)}$ is 10 to 30%;

(iii) surface area ratio $\Delta S^{5(0.02-0.2)}$ is 30 to 70%;

(iv) steepness $a45^5$ is 20 to 50%;

(v) steepness $a45^{5(0.02-5)}$ is 5 to 20%; and (vi) steepness $a45^{5(0.02-0.2)}$ is 20 to 60%, wherein $\Delta S^5$ which is found by the following equation from actual area $S_x^5$ found by approximation three-point method from said three-dimensional data and geometrically measured area $S_0^5$ is surface area ratio expressed by $\Delta S^5=[(S_x^5-S_0^5)/S_0^5]\times100(\%)$;

$\Delta S^{5(0.2-5)}$ which is found by the following equation from actual area $S_x^{5(0.2-5)}$ obtained by extracting a component with wavelength of 0.2 μm or longer and 5 μm or shorter from said three-dimensional data and geometrically measured areas $S_0^5$ is surface area ratio expressed by $\Delta S^{5(0.2-5)}=[(S_x^{5(0.2-2.5)}-S_0^5)/S_0^5]\times100(\%)$;

$\Delta S^{5(0.02-0.2)}$ which is found by the following equation from actual area $S_x^{5(0.02-0.2)}$ obtained by extracting a component with a wavelength of 0.02 μm or longer and 0.2 μm or shorter from said three-dimensional data and geometrically measured area $S_0^5$ is surface area ratio expressed by $\Delta S^{5(0.02-0.2)}=[(S_x^{5(0.02-0.2)}-S_0^5)/S_0^5]\times100(\%)$;

steepness $a45^5$ is an area rate of a portion (area) having a slant with size of angle of 45° or bigger) to actual area $S_x^5$ found by approximation three-point method from said three-dimensional data;

steepness $a45^{5(0.2-5)}$ is an area rate of a portion (area) having a slant with size of angle of 45° or bigger (gradient of 45° or bigger) to actual area $S_x^{5(0.2-5)}$ found by extracting a component with wavelength of 0.2 μm or longer and 5 μm or shorter from said three-dimensional data; and steepness $a45^{5(0.02-0.2)}$ is an area rate of a portion (area) having a slant with size of angle of 45° or bigger (gradient of 45° or bigger) to actual area $S_x^{5(0.02-0.2)}$ found by extracting a component with wavelength of 0.02 μm or longer and 0.2 μm or shorter from said three-dimensional data.

23. The support for a lithographic printing plate according to claim 22, wherein the number of local deep areas with a depth of 5 μm or more existent on the surface is 1.0 or less per 400 μm×400 μm.

24. The support for a lithographic printing plate according to claim 22, wherein Si atom attached quantity on the surface is 0.1 to 30 mg/m$^2$.

25. A presensitized plate provided with an image recording layer on the support for a lithographic printing plate according to claim 22.

26. The presensitized plate according to claim 25, wherein the presensitized plate is a presensitized plate for a laser printing plate.

27. A support for a lithographic printing plate obtained by performing graining treatment including electrochemical graining treatment on an aluminum plate, wherein said aluminum plate is an aluminum plate which is manufactured by a method including molten metal treatment, and contains Fe of 0.20 to 0.29 wt %, Si of 0.03 to 0.15 wt %, Cu of 0.032 to 0.040 wt % and Ti of 0.050 wt % or less and whose remaining portion is composed of Al and unavoidable impurities, wherein said electrochemical graining treatment is performed in order of nitric acid electrolytic graining and hydrochloric acid graining, and wherein surface area ratio and steepness obtained from three-dimensional data by measuring 512×512 points in 50 μm×50 μm on the surface with an atomic force microscope each satisfies the following conditions (xi) to (xvi):

(xi) surface area ratio $\Delta S^{50}$ is 30 to 70%;

(xii) surface area ratio $\Delta S^{50(2-50)}$ is 5 to 10%;

(xiii) surface area ratio $\Delta S^{50(0.2-2)}$ is 15 to 40%;

(iv) steepness $a45^{50}$ is 25 to 60%;

(xv) steepness $a45^{50(2.50)}$ is 0 to 3.0%; and (xvi) steepness $a45^{50(0.2-2)}$ is 10 to 40%, wherein $\Delta S^{50}$ which is found by the following equation from actual area $S_x^{50}$ found by an approximation three-point method from said three-dimensional data and geometrically measured area $S_0^{50}$ is surface area ratio expressed by $\Delta S^{50}=[(S_x^{50}-S_0^{50})/S_0^{50}]\times 100(\%)$;

$\Delta S^{50}$ which is found by the following equation from actual area $S_x^{50(2-50)}$ obtained by extracting a component with wavelength of 2 μm or longer and 50 μm or shorter from said three-dimensional data and geometrically measured area $S_0^{50}$ is surface area ratio expressed by $\Delta S^{50(2-50)}=[(S_x^{50(2-50)}-S_0^{50})/S_0^{50}]\times 100(\%)$;

$\Delta S^{50(0.2-2)}$ which is found by the following equation from actual area $S_x^{50(0.2-2)}$ obtained by extracting a component with wavelength of 0.2 μm or longer and 2 μm or shorter from said three-dimensional data and geometrically measured area $S_0^{50}$ is surface area ratio expressed by $\Delta S^{50(0.2-2)}=[(S_x^{50(0.2-2)}-S_0^{50})/S_0^{50}]\times 100(\%)$;

steepness $a45^{50}$ is an area rate of a portion (area) having a slant with size of angle of 45° or bigger (gradient of 45° or bigger) to actual area $S_x^{50}$ found by approximation three-point method from said three-dimensional data;

steepness $a45^{50(2-50)}$ is an area rate of a portion (area) having a slant with size of angle of 45° or bigger (gradient of 45° or bigger) to actual area $S_x^{50(2-50)}$ found by extracting a component with wavelength of 2 μm or longer and 50 μm or shorter from said three-dimensional data; and steepness $a45^{50(0.2-2)}$ is the area rate of a portion (area) having a slant with size of angle of 45° or bigger (gradient of 45° or bigger) to actual area $S_x^{50(0.2-2)}$ found by extracting a component with wavelength of 0.2 μm or longer and 2 μm or shorter from said three-dimensional data.

28. The support for a lithographic printing plate according to claim 27, wherein the number of local deep areas with a depth of 5 μm or more existent on the surface is 1.0 or less per 400 μm×400 μm.

29. The support for a lithographic printing plate according to claim 27, wherein Si atom attached quantity on the surface is 0.1 to 30 mg/$m^2$.

30. A presensitized plate provided with an image recording layer on the support for a lithographic printing plate according to claim 27.

31. The presensitized plate according to claim 30, wherein the presensitized plate is a presensitized plate for a laser printing plate.

* * * * *